(12) United States Patent
Park et al.

(10) Patent No.: US 10,600,643 B2
(45) Date of Patent: Mar. 24, 2020

(54) METHOD OF FORMING THIN FILM AND METHOD OF MANUFACTURING INTEGRATED CIRCUIT DEVICE USING THE SAME

(71) Applicant: SAMSUNG ELECTRONICS CO., LTD., Suwon-si, Gyeonggi-do (KR)

(72) Inventors: Gyu-hee Park, Hwaseong-si (KR); Youn-soo Kim, Yongin-si (KR); Hyun-jun Kim, Seoul (KR); Jin-sun Lee, Suwon-si (KR); Jae-soon Lim, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 138 days.

(21) Appl. No.: 15/866,568

(22) Filed: Jan. 10, 2018

(65) Prior Publication Data
US 2018/0342391 A1     Nov. 29, 2018

(30) Foreign Application Priority Data
May 25, 2017     (KR) .................. 10-2017-0064881

(51) Int. Cl.
*H01L 21/02*     (2006.01)
*C23C 16/40*     (2006.01)
(Continued)

(52) U.S. Cl.
CPC .... *H01L 21/02304* (2013.01); *C23C 16/0272* (2013.01); *C23C 16/06* (2013.01);
(Continued)

(58) Field of Classification Search
CPC ......... H01L 21/02178; H01L 21/02189; H01L 21/0228; H01L 21/02304; H01L 21/02181;
(Continued)

(56) References Cited

U.S. PATENT DOCUMENTS 7,476,627 B2   1/2009 Pomarede et al.
7,709,386 B2 *  5/2010 Ji ...................... C23C 16/45529
                                                        438/681

(Continued)

FOREIGN PATENT DOCUMENTS

KR     10-2009-0013852 A     2/2009

*Primary Examiner* — Michael M Trinh
(74) *Attorney, Agent, or Firm* — Lee IP Law, PC

(57) ABSTRACT

A method of forming a thin film and an integrated circuit device, including forming a first reaction inhibiting layer chemisorbed on a first portion of a lower film by supplying a reaction inhibiting compound having a carbonyl group to an exposed surface of the lower film at a temperature of about 300° C. to about 600° C.; forming a first precursor layer of a first material chemisorbed on a second portion of the lower film at a temperature of about 300° C. to about 600° C., the second portion being exposed through the first reaction inhibiting layer; and forming a first monolayer containing the first material on the lower film by supplying a reactive gas to the first reaction inhibiting layer and the first precursor layer and removing the first reaction inhibiting layer from the surface of the lower film, and thus exposing the first portion.

14 Claims, 36 Drawing Sheets

(51) Int. Cl.
*H01L 27/11582* (2017.01)
*H01L 27/108* (2006.01)
*C23C 16/455* (2006.01)
*C23C 16/06* (2006.01)
*C23C 16/02* (2006.01)
*H01L 21/28* (2006.01)
*H01L 27/1157* (2017.01)

(52) U.S. Cl.
CPC .......... *C23C 16/403* (2013.01); *C23C 16/405* (2013.01); *C23C 16/45529* (2013.01); *C23C 16/45553* (2013.01); *H01L 21/0228* (2013.01); *H01L 21/02178* (2013.01); *H01L 21/02189* (2013.01); *H01L 21/02312* (2013.01); *H01L 21/02356* (2013.01); *H01L 27/10808* (2013.01); *H01L 27/10852* (2013.01); *H01L 27/1157* (2013.01); *H01L 27/11582* (2013.01); *H01L 29/40117* (2019.08)

(58) Field of Classification Search
CPC ........... H01L 21/02312; H01L 27/1157; H01L 27/10808; H01L 27/10852; H01L 27/11582; C23C 16/403; C23C 16/405; C23C 16/45553; C23C 16/45529
See application file for complete search history.

(56) References Cited

U.S. PATENT DOCUMENTS

| | | | |
|---|---|---|---|
| 7,888,726 B2 | 2/2011 | Hirota et al. | |
| 8,012,823 B2* | 9/2011 | Lim | H01L 21/3141 438/239 |
| 8,835,273 B2 | 9/2014 | Chen et al. | |
| 8,945,305 B2* | 2/2015 | Marsh | C23C 16/0227 117/103 |
| 8,951,615 B2* | 2/2015 | Elam | C23C 16/45553 427/157 |
| 9,076,647 B2* | 7/2015 | Chung | H01L 21/02164 |
| 9,412,806 B2 | 8/2016 | Wang et al. | |
| 9,587,307 B2 | 3/2017 | Haukka et al. | |
| 2008/0242097 A1* | 10/2008 | Boescke | C30B 25/04 438/703 |
| 2013/0129922 A1 | 5/2013 | Sasagawa et al. | |
| 2016/0276148 A1 | 9/2016 | Qian et al. | |
| 2017/0040172 A1 | 2/2017 | Moon et al. | |

* cited by examiner

METHOD OF FORMING THIN FILM AND METHOD OF MANUFACTURING INTEGRATED CIRCUIT DEVICE USING THE SAME

CROSS-REFERENCE TO RELATED APPLICATION

Korean Patent Application No. 10-2017-0064881, filed on May 25, 2017, in the Korean Intellectual Property Office, and entitled: "Method of Forming Thin Film and Method of Manufacturing Integrated Circuit Device Using the Same," is incorporated by reference herein in its entirety.

BACKGROUND

1. Field

Embodiments relate to a method of forming a thin film and a method of manufacturing an integrated circuit device using the same.

2. Description of the Related Art

As the degree of integration of an integrated circuit device increases, an aspect ratio of the structures constituting the integrated circuit device may be greatly increased.

SUMMARY

The embodiments may be realized by providing a method of forming a thin film, the method including forming a first reaction inhibiting layer chemisorbed on a first portion of a lower film by supplying a reaction inhibiting compound having a carbonyl group to an exposed surface of the lower film at a temperature of about 300° C. to about 600° C.; forming a first precursor layer of a first material chemisorbed on a second portion of the lower film at a temperature of about 300° C. to about 600° C., the second portion being exposed through the first reaction inhibiting layer; and forming a first monolayer containing the first material on the lower film by supplying a reactive gas to the first reaction inhibiting layer and the first precursor layer and removing the first reaction inhibiting layer from the surface of the lower film, and thus exposing the first portion.

The embodiments may be realized by providing a method of forming a thin film, the method including forming a lower film on a substrate at a first temperature such that the lower film includes a first metal oxide, at least some portions of the lower film being in an amorphous state; forming a reaction inhibiting layer chemisorbed on a first portion of the lower film by supplying a reaction inhibiting compound having a carbonyl group to an exposed surface of the lower film while crystallizing at least some portions of the lower film at a second temperature, the second temperature being greater than the first temperature, forming a second metal precursor layer chemisorbed on a second portion of the lower film at a third temperature that is greater than the first temperature, the second portion of the lower film being exposed through the reaction inhibiting layer, and forming a first monolayer that includes a second metal oxide from the second metal precursor layer by supplying a reactive gas to the reaction inhibiting layer and the second metal precursor layer, and simultaneously exposing some portions of the lower film through the first monolayer by removing the reaction inhibiting layer from the lower film.

The embodiments may be realized by providing a method of manufacturing an integrated circuit device, the method including forming a lower structure on a substrate, and forming an aluminum-containing film on the lower structure by performing the method according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
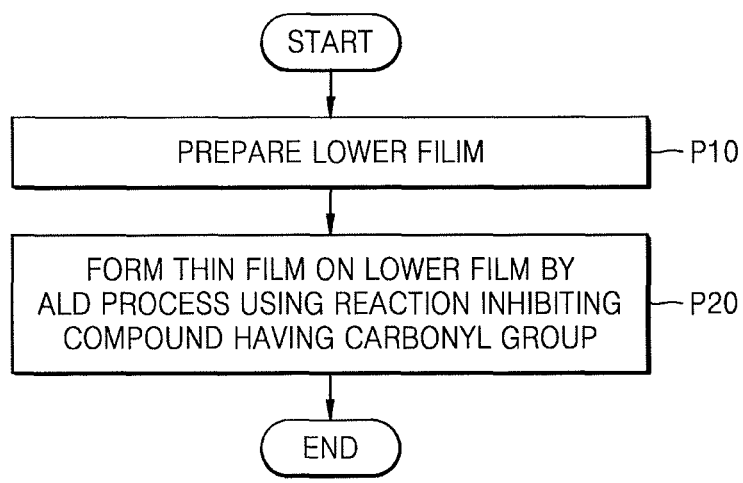
FIG. 1 illustrates a flowchart showing a thin film forming method according to an embodiment.
Figure 2A:
FIGS. 2A and 2B illustrate cross-sectional views of stages in the thin film forming method shown in FIG. 1 in more detail.
Figure 2B:
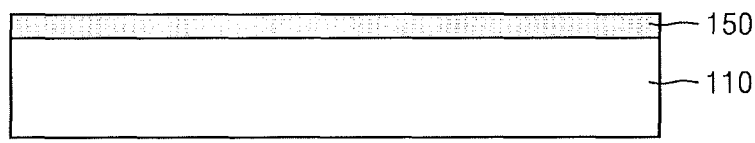

FIG. 1 illustrates a flowchart showing a thin film forming method according to an embodiment. FIGS. 2A and 2B illustrate cross-sectional views of stages in the thin film forming method shown in FIG. 1 in more detail.

Referring to FIGS. 1 and 2A, in process P10, a lower film 110 may be prepared. The lower film 110 may be a semiconductor film, an insulating film, a dielectric film, or a conductive film. The lower film 110 may include, e.g., a Group IV semiconductor or a Group III-V compound semiconductor, silicon oxide, silicon nitride, metal, metal oxide, metal nitride, or a combination thereof, of the periodic table of International Union of Pure and Applied Chemistry (IUPAC).

Referring to FIGS. 1 and 2B, in process P20, a thin film 150 may be formed on the lower film 110 by an atomic layer deposition (ALD) process using a reaction inhibiting compound having a carbonyl group.

The ALD process for forming the thin film 150 may be performed at a temperature of, e.g., about 300° C. to about 600° C. For example, the thin film 150 may be formed in a reaction chamber while maintaining the internal temperature of the reaction chamber of the ALD apparatus at about 300° C. to about 600° C. and maintaining the internal pressure at about 10 Pa to atmospheric pressure.

The thin film 150 may include, e.g., a metal oxide, a metal nitride, a semi-metal oxide, or a semi-metal nitride. The metal or the semi-metal may be selected from, e.g., aluminum (Al), zirconium (Zr), lithium (Li), beryllium (Be), boron (B), sodium (Na), magnesium (Mg), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), rubidium (Rb), strontium (Sr), yttrium (Y), niobium (Nb), molybdenum (Mo), technetium (Tc), ruthenium (Ru), rhodium (Rh), palladium (Pd), silver (Ag), cadmium (Cd), indium (In), tin (Sn), antimony (Sb), cesium (Cs), barium (Ba), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), hafnium (Hf), tantalum (Ta), tungsten (W), rhenium (Re), osmium (Os), iridium (Ir), platinum (Pt), gold (Au), mercury (Hg), lead (Pb), bismuth (Bi), polonium (Po), radium (Ra), actinium (Ac), and silicon (Si). In an implementation, the thin film 150 may be, e.g., an Al oxide film, a Zr oxide film, a Hf oxide film, a La oxide film, a Si oxide film, a Ta oxide film, a Nb oxide film, a Zr nitride film, an Al nitride film, a Hf nitride film, a La nitride film, a Si nitride film, a Ta nitride film, a Nb nitride film, or a combination thereof.

The thin film 150 may be used for various purposes. In an implementation, the thin film 150 may be used for a dielectric film constituting a part of a capacitor of a semiconductor memory device, a gate dielectric film of a transistor, a conductive barrier film used for wiring, a resistive film, a magnetic film, a barrier metal film for a liquid crystal, solar cell members, members for semiconductor equipment, nanostructures, hydrogen storage alloys, and micro electro mechanical systems (MEMS) actuators, and etc.

Figure 3:
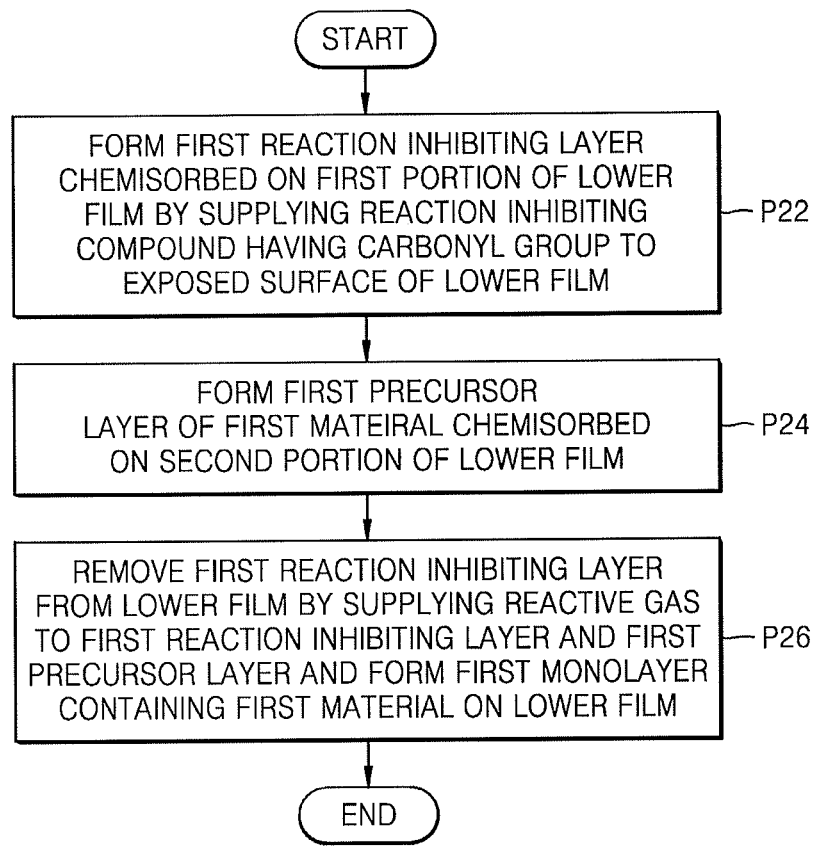
FIG. 3 illustrates a flowchart showing a thin film forming method according to an embodiment.
Figure 4A:
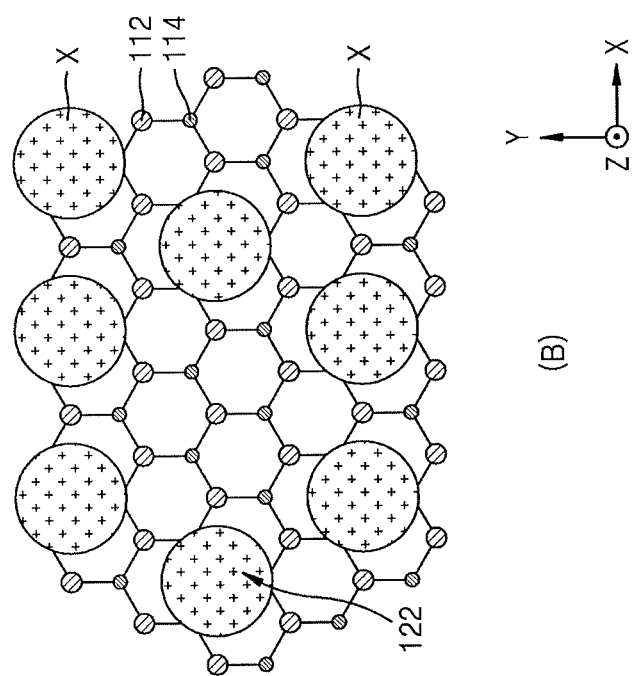
FIGS. 4A to 4C illustrate schematic views of some components in order to explain the thin film forming method described in FIG. 3 in more detail.
Figure 4A:
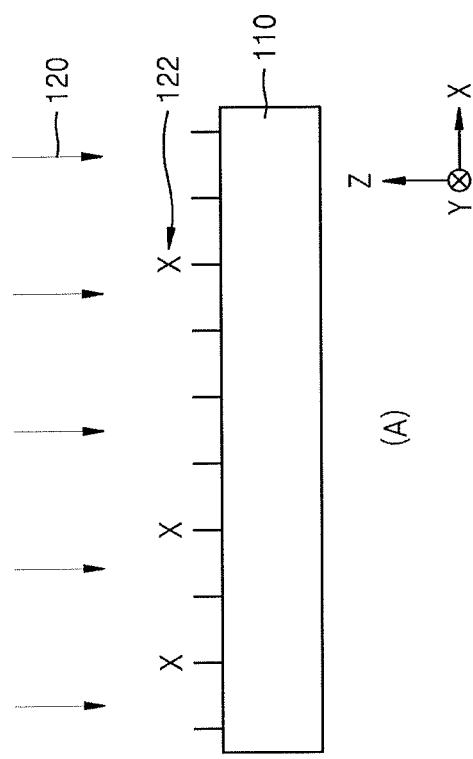
Figure 4B:
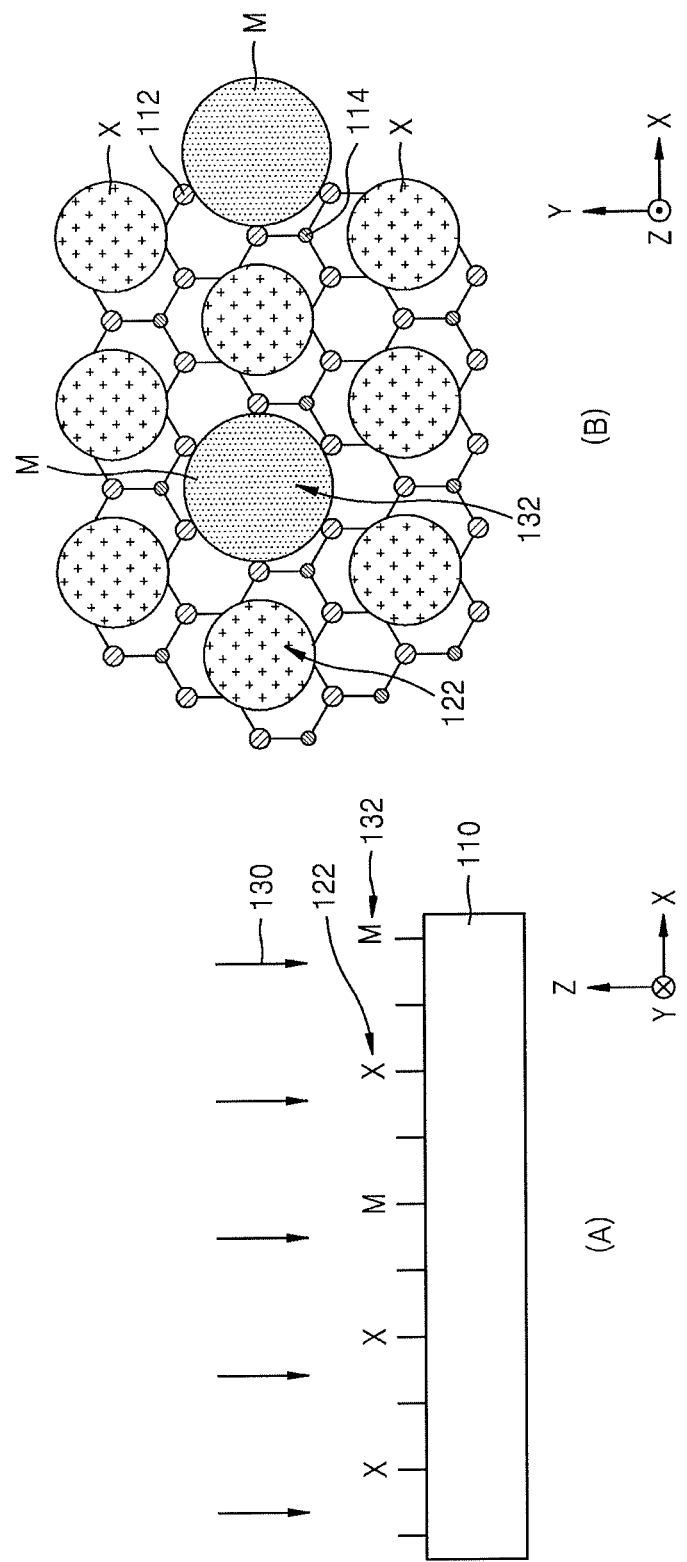
Figure 4C:
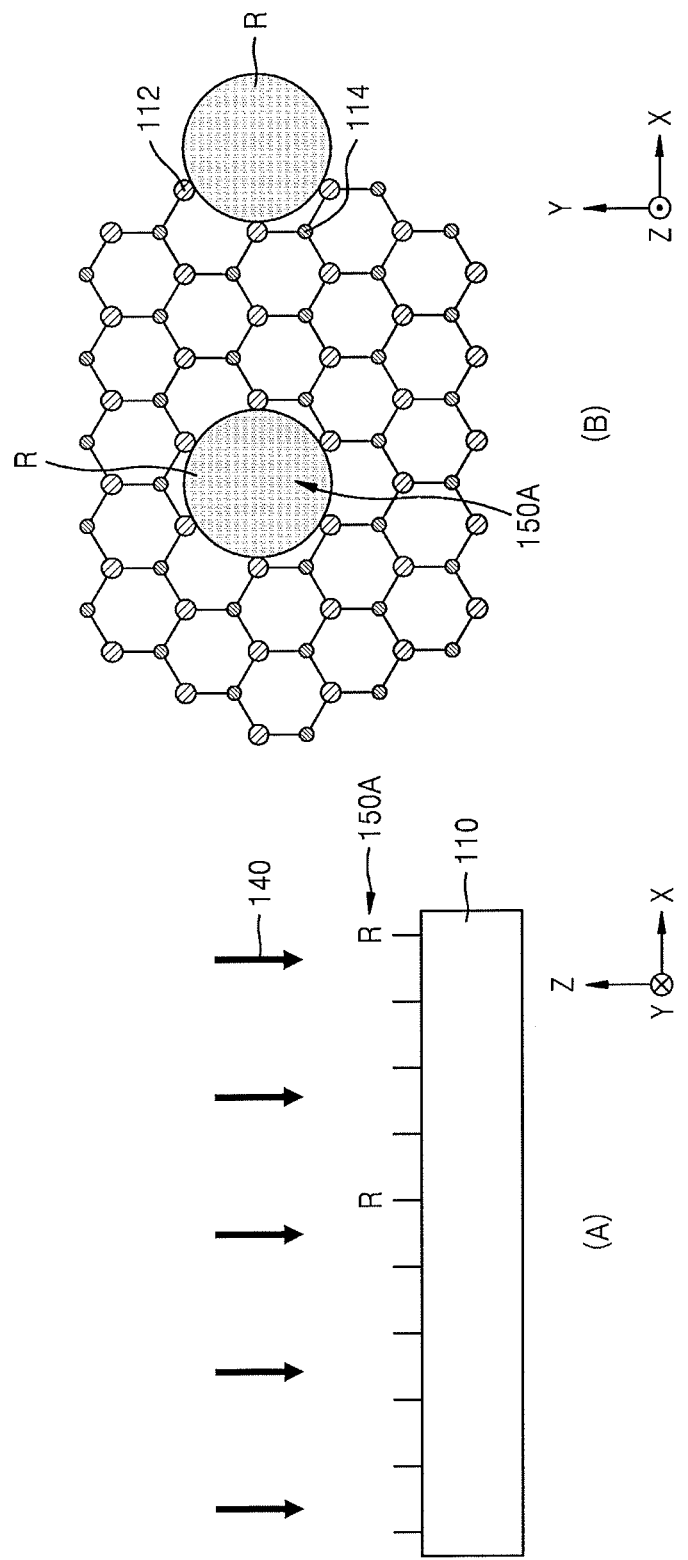

FIG. 3 illustrates a flowchart showing a method, in more detail, of forming a thin film according to an embodiment. FIGS. 4A to 4C illustrate schematic views of some components in order to explain the thin film forming method described in FIG. 3 in more detail.

In FIGS. 4A to 4C, part (A) illustrates a cross-sectional view for explaining a thin film forming method, which is described in FIG. 3, and part (B) illustrates a view showing an exemplary planar configuration of some components shown in part (A). Referring to FIG. 3 and FIGS. 4A to 4C, a thin film forming method will be described in more detail according to process P20 of FIG. 1.

Referring to FIGS. 3 and 4A, in process P22, a reaction inhibiting compound 120 having a carbonyl group may be provided to an exposed surface of the lower film 110 and may be chemisorbed (e.g., chemically bonded) on a first portion of the lower film 110 such that a first reaction inhibiting layer 122 is formed.

A plurality of center atoms 112 and a plurality of reactive elements 114, constituting the lower film 110, may be exposed in an exposed surface of the lower film 110 prepared by process P10 of FIG. 1. The plurality of center atoms 112 may consist of or include a metal or a semi-metal. The plurality of reactive elements 114 may be atoms or functional groups having an incomplete bonding with oxygen. In an implementation, each of the center atoms 112 may be Zr, and each of the reactive elements 114 may be an oxygen atom.

In order to form the first reaction inhibiting layer 122 on the lower film 110 according to process P22, the reaction inhibiting compound 120 may be provided to an exposed surface of the lower film 110 at a temperature of about 300° C. to about 600° C. As a result, at least one oxygen atom derived from the carbonyl group of the reaction inhibiting compound 120 may be bonded to at least one or each center atom 112 exposed on the surface of the lower film 110, such that a plurality of reaction inhibiting functional groups X derived from the reaction inhibiting compound 120 may be chemisorbed on the first portion of the lower film 110 to form the first reaction inhibiting layer 122. The first reaction inhibiting layer 122 may include a monolayer consisting of or including the plurality of reaction inhibiting functional groups X chemisorbed on the surface of the lower film 110. The monolayer means a thin material layer and it could be taken as low as a single atomic layer, but it is not limited to meaning of a single atomic layer.

On the first reaction inhibiting layer 122 and the lower film 110, the reaction inhibiting functional group X and extra compounds, which are derived from the reaction inhibiting compound 120 provided on the lower film 110 may be physisorbed. Such extra materials and by-products may be removed by a purge process. The purge process may be performed by using an inert gas. e.g., helium (He), neon (Ne), or argon (Ar), or nitrogen ($N_2$) at a temperature of about 300° C. to about 600° C.

In an implementation, the reaction inhibiting compound 120 may include, e.g., a ketone functional group, a diketone functional group, a triketone functional group, a ketene functional group, an aldehyde functional group, an ester functional group, a carboxylic acid functional group, or an amide functional group.

In an implementation, the reaction inhibiting compound 120 may include, e.g., an alkyl-substituted β-diketone compound such as acetylacetone, 3,5-heptanedione, 2,4-hexanedione, 5-methyl-2,4-hexanedione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonan-4,6-dione, 2-methyl-6-ethyldecane-3,5-dione, and 2,2-dimethyl-6-ethyldecane-3,5-dione.

In an implementation, the reaction inhibiting compound 120 may include, e.g., a ketone compound such as propanone, butanone, 2-pentanone, 3-pentanone, acetophenone, and benzophenone.

In an implementation, the reaction inhibiting compound 120 may include, e.g., an aldehyde compound such as methanal, ethanal, propanal, butanal, pentanal, and 2-methylpropanal.

In an implementation, the reaction inhibiting compound 120 may include, e.g., an ester compound such as methyl acetate, ethyl acetate, propyl acetate, butyl acetate, and tert-butyl acetate.

In an implementation, the reaction inhibiting compound 120 may include, e.g., a carboxylic acid compound such as acetic acid, oxalic acid, glyoxylic acid, glycolic acid, propanoic acid, prop-2-enoic acid, 2-propiolic acid, propanedioic acid, 2-hydroxypropanedioic acid, oxopropanedioic acid, 2,2-dihydroxypropanedioic acid, 2-oxopropanoic acid, 2-hydroxypropanoic acid, 3-hydroxypropanoic acid, 2-oxirane carboxylic acid, butanoic acid, 2-methylpropanoic acid, butanedioic acid, 3-oxobutanoic acid, (E)-butenedioic acid, (Z)-butenedioic acid, oxobutanedioic acid, hydroxybutanedioic acid, 2,3-dihydroxybutanedioic acid, (E)-but-2-enoic acid, pentanoic acid, 3-methylbutanoic acid, pentanedioic acid, 2-oxopentanedioic acid, hexanoic acid, hexanedioic acid, 2-hydroxypropane-1,2,3-tricarboxylic acid, prop-1-ene-1,2,3-tricarboxylic acid, 1-hydroxypropane-1,2,3-tricarboxylic acid, and (2E,4E)-hexa-2,4-dienoic acid.

In an implementation, a compound having various functional groups such as an ether functional group, and an amine functional group may be used as the reaction inhibiting compound 120. In an implementation, the reaction inhibiting compound 120 may include, e.g., a compound such as dimethoxymethane, dimethoxyethane, 1,1-dimethoxyethane, acetic anhydride, dicarbonic acid, dimethyl pyrocarbonate, diethyl pyrocarbonate, bis(dimethylamino)methane, tetramethylethylenediamine, tris(dimethylamino)methane, ethylenediamine, amidine, acetamidine, formamidine, N,N'-bis(2-methyl-2-propanyl)imidoformamide, and N,N'-dimethylimidoformamide.

In process P22, after the first reaction inhibiting layer 122 is formed, the center atoms 112 and the reactive elements 114 of the lower film 110 may be exposed in some other regions of the lower film 110 exposed through the first reaction inhibiting layer 122.

Referring to FIGS. 3 and 4B, in process P24, a first precursor layer 132 of a first material chemisorbed on a second portion, which is some other regions of the lower film 110 exposed through the first reaction inhibiting layer 122, may be formed.

To form the first precursor layer 132, a precursor 130 may be provided at a temperature of about 300° C. to about 600° C. on the lower film 110 where the first reaction inhibiting layer 122 has been formed.

In an implementation, the first material may be a metal or a semi-metal. In an implementation, the first material may be, e.g., aluminum (Al), and the precursor 130 may be an Al precursor. In an implementation, the precursor 130 may be, e.g., trimethyl aluminum (TMA), triethyl aluminum (TEA), 1-methylpyrrolidine alane (MPA), dimethylethylamine alane (DMEAA), dimethyl aluminum hydride (DMAH), or trimethylaminealane borane (TMAAB).

The first precursor layer 132 may include a monolayer composed of a plurality of precursor functional groups M chemisorbed on the second portion of the surface exposed through the first reaction inhibiting layer 122 in the lower film 110. A portion covered by the first reaction inhibiting layer 122 in the lower film 110 inhibits chemical bonding of the plurality of precursor functional groups M by the first reaction inhibiting layer 122, and the plurality of precursor functional groups M are only chemically bonded to a surface exposed through the first reaction inhibiting layer 122 in the lower film 110, thus forming the first precursor layer 132. The first precursor layer 132 on the lower film 110 may have a superdense structure in the form of a plurality of quantum dots.

In an implementation, the lower film 110 may include a $ZrO_2$ film, which is at least partially crystallized, and the first precursor layer 132 may be formed along a grain boundary of the $ZrO_2$ film.

After the first precursor layer 132 is formed, the precursor functional groups M and extra compounds, which are physisorbed on the lower film 110, may remain on the lower film 110. Such extra compounds may be removed by a purge process. The purge process may be performed by using an inert gas, e.g., He, Ne, and Ar, or $N_2$ at a temperature of about 300° C. to about 600° C.

Referring to FIGS. 3 and 4C, a reactive gas 140 may be provided to the first reaction inhibiting layer 122 and the first precursor layer 132 shown in FIG. 4B and then the first reaction inhibiting layer 122 may be removed from the lower film 110 so that a first monolayer 150A including the first material may be formed on the lower film 110.

The reactive gas 140 may be provided to the first reaction inhibiting layer 122 and the first precursor layer 132 shown in FIG. 4B and the plurality of reaction inhibiting functional groups X chemisorbed on the lower film 110 may be desorbed by the reaction between the plurality of reaction inhibiting functional groups X of the first reaction inhibiting layer 122 and the reactive gas 140, such that the first reaction inhibiting layer 122 may be removed. As a result, the first portion of the lower film 110 may be exposed again. At the same time, a plurality of reaction resultants R may be left on the lower film 110 by the reaction between the plurality of precursor functional groups M of the first precursor layer 132 and the reactive gas 140, such that the first monolayer 150A consisting of the plurality of reaction resultants R may be formed on the lower film 110. The first monolayer 150A may have a superdense structure in the form of a plurality of quantum dots.

The reactive gas 140 may be provided in a gaseous state or in a plasma state. The reactive gas 140 may be an oxidizing gas or a nitriding gas. In an implementation, the reactive gas 140 may be, e.g., an oxidizing gas selected from $O_2$, $O_3$, plasma $O_2$, $H_2O$, $NO_2$, NO, nitrous oxide ($N_2O$), $CO_2$, $H_2O_2$, HCOOH, $CH_3COOH$, $(CH_3CO)_2O$, and a combination thereof. In an implementation, the reactive gas 140 may be, e.g., selected from $NH_3$, mono-alkyl amine, di-alkyl amine, tri-alkyl amine, an organic amine compound, a hydrazine compound, and a combination thereof.

After the first monolayer 150A is formed, excess reactive gas 140 and unnecessary materials remaining on the lower film 110 and the first monolayer 150A may be removed by a purge process. The purge process may be performed by using an inert gas, e.g., He, Ne, and Ar, or $N_2$ at a temperature of about 300° C. to about 600° C.

In an implementation, the first precursor layer 132 shown in FIG. 4B may include Al, and when the reactive gas 140 is an oxidizing gas, the first monolayer 150A may include an Al oxide. When at least some portions of the lower film 110 have a crystalline structure, the first monolayer 150A may be formed along a grain boundary exposed on a surface of the lower film 110.

Figure 5:
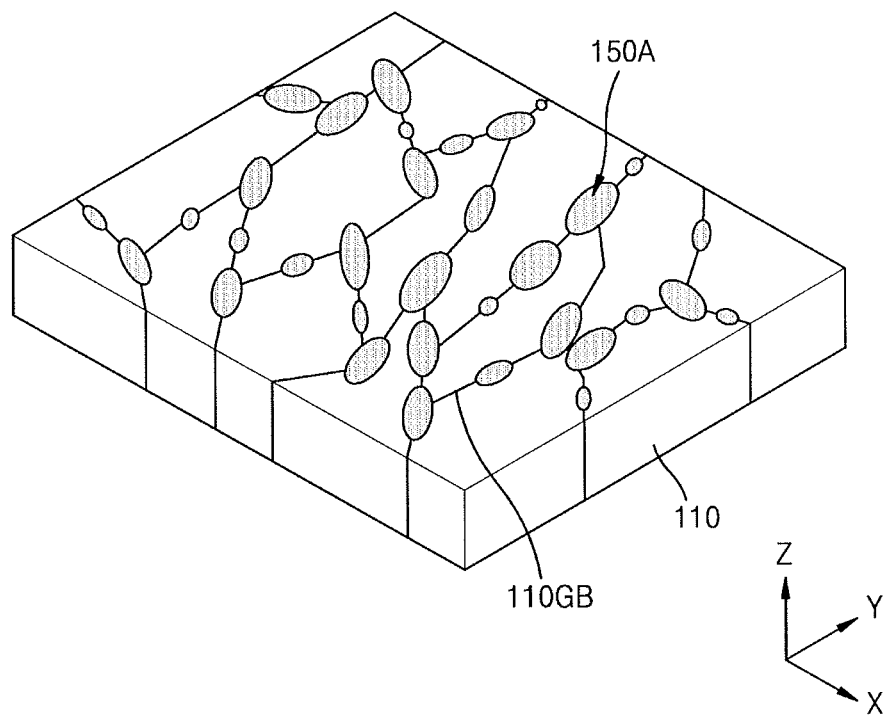
FIG. 5 illustrates a perspective view showing an exemplary shape of a first monolayer formed according to a thin film forming method.

FIG. 5 illustrates a perspective view showing an exemplary shape of the first monolayer 150A formed on the lower film 110, of which at least some portions have a crystalline structure.

Referring to FIG. 5, when at least some portions of the lower film 110 have a crystalline structure, the first monolayer 150A may be formed along the grain boundary 110GB exposed on a surface of the lower film 110. In an implementation, at least some portions of the lower film 110 may be a tetragonal $ZrO_2$ (t-$ZrO_2$) film having a crystalline structure, and in this case, the first monolayer 150A may be in the form of a plurality of quantum dots formed along the grain boundary 110GB of the $ZrO_2$ film.

Figure 6:
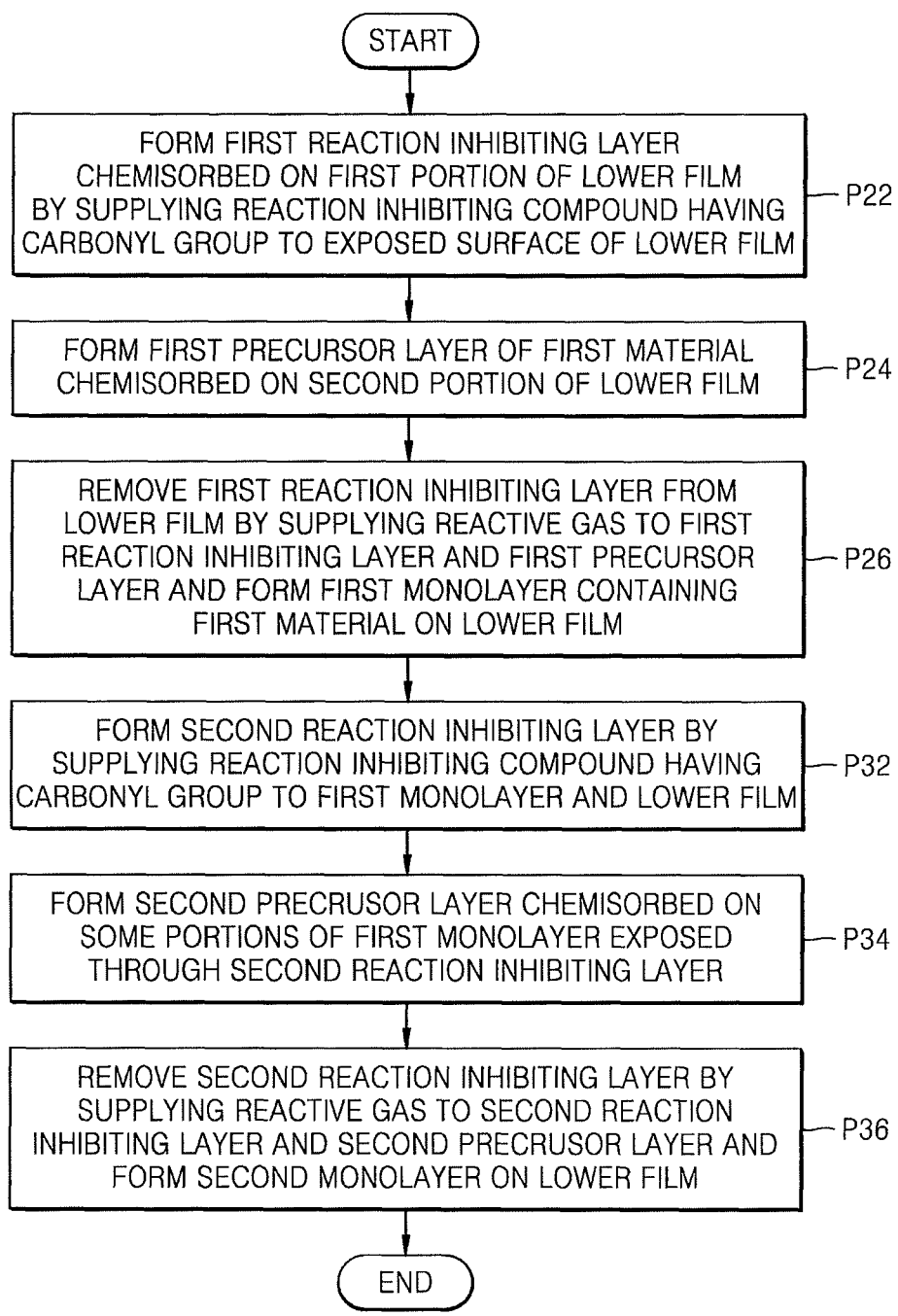
FIG. 6 illustrates a flowchart showing a thin film forming method according to another embodiment.
Figure 7A:
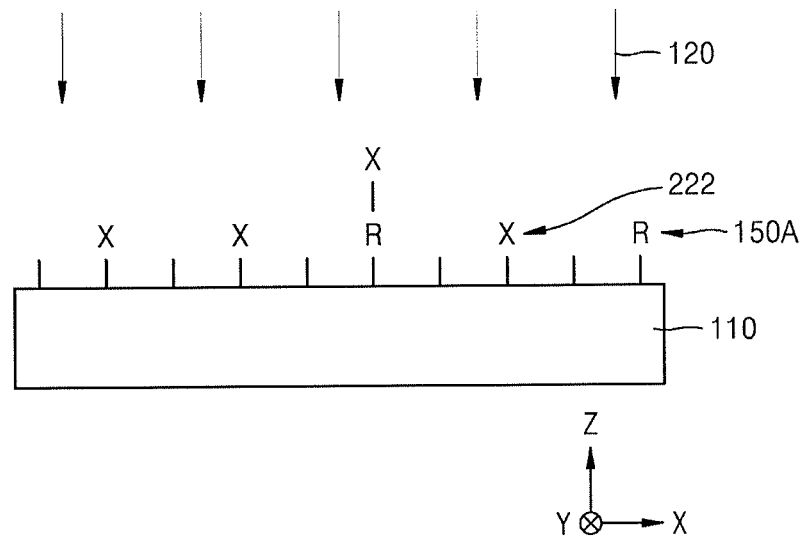
FIG. 7A to 7C illustrate schematic views of some components in order to explain the thin film forming method described in FIG. 6 in more detail.
Figure 7B:
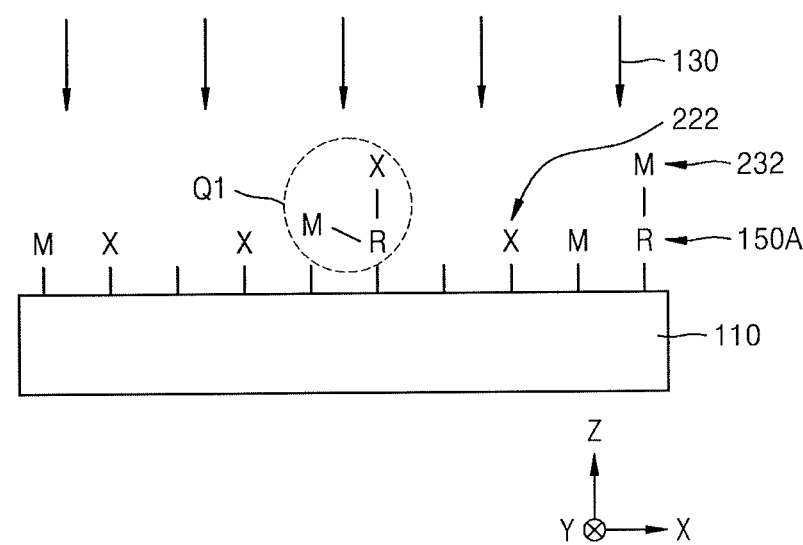
Figure 7C:
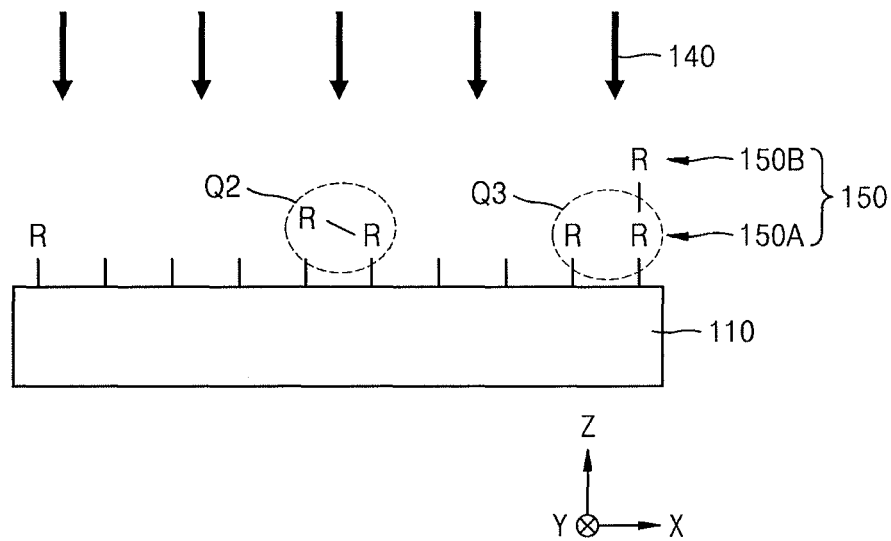

FIG. 6 illustrates a flowchart showing a thin film forming method according to another embodiment. FIGS. 7A to 7C illustrate cross-sectional views of some configurations according to processes of the thin film forming method described in FIG. 6.

Referring to FIG. 6, process P22, process P24, and process P26 may be performed in the same manner as described with reference to FIG. 3 and FIGS. 4A to 4C.

Referring to FIGS. 6 and 7A, in process P32, the reaction inhibiting compound 120 having a carbonyl group may be provided to an exposed surface of the first monolayer 150A and the lower film 110 to form a second reaction inhibiting layer 222 chemisorbed on the first monolayer 150A and the lower film 110. To form the second reaction inhibiting layer 222 on the lower film 110, the reaction inhibiting compound 120 may be provided at a temperature of about 300° C. to about 600° C. At least one oxygen atom derived from a carbonyl group of the reaction inhibiting compound 120 may be bonded with at least one or each center atom 112 exposed on a surface of the lower film 110 and thus, a plurality of reaction inhibiting functional groups X derived from the reaction inhibiting compound 120 may be chemisorbed on some portions of the lower film 110 and some portions of the first monolayer 150A, thus forming the second reaction inhibiting layer 222. The second reaction inhibiting layer 222 may include a monolayer consisting of or including the plurality of reaction inhibiting functional groups X chemisorbed on the surface of the lower film 110 and the surface of the first monolayer 150A. Some portions of the first monolayer 150A and some portions of the lower film 110 may be exposed through the second reaction inhibiting layer 222.

Unnecessary compounds on the second reaction inhibiting layer 222 may be removed by a purge process. The purge process may be performed in the same manner as the purge process in process P22 of FIG. 3.

Referring to FIGS. 6 and 7B, in process P34, a second precursor layer 232 of a first material (e.g., the same first material described above) chemisorbed on some portions of the first monolayer 150A and some portions of the lower film 110, which are exposed through the second reaction inhibiting layer 222, may be formed. To form the second precursor layer 232, the precursor 130 may be provided at a temperature of about 300° C. to about 600° C. on the lower film 110 where the first monolayer 150A and the second reaction inhibiting layer 222 are formed.

The second precursor layer 232 may include a monolayer consisting of or including the plurality of precursor functional groups M chemisorbed on the portions of the lower film 110 and the first monolayer 150A exposed through the second reaction inhibiting layer 222. The portions of the lower film 110 and the first monolayer 150A covered by the second reaction inhibiting layer 222 may inhibit a chemical bonding of the plurality of precursor functional groups M by the second reaction inhibiting layer 222, such that the second precursor layer 232 is not formed, and the plurality of precursor functional groups M may only be chemically bonded to the portions exposed through the second reaction inhibiting layer 222, such that the second precursor layer 232 is formed. In addition, some reaction resultants R of a plurality of reaction resultants R contained in the first monolayer 150A may be already bonded with a reaction inhibiting functional group X in a vertical thickness direction of the first monolayer 150A (Z direction) before the precursor 130 is provided according to process P34. In this regard, when new precursor functional group M is bonded with the reaction resultant R of the first monolayer 150A, which the reaction inhibiting functional group X is already bonded with, the new precursor functional group M may be chemisorbed on the reaction resultant R of the first monolayer 150A in a direction which is more close to an extension direction of a main surface of the lower film 110 (X-Y planar surface) rather than the vertical thickness direction (Z direction) as illustrated in a dotted line Q1 of FIG. 7B.

Unnecessary compounds remained on the second precursor layer 232 may be removed by a purge process. The purge process may be performed in the same manner as the purge process in process P24 of FIG. 3.

Referring to FIGS. 6 and 7C, in process P36, the reactive gas 140 may be provided to the second reaction inhibiting layer 222 and the second precursor layer 232 to remove the second reaction inhibiting layer 222, followed by forming a second monolayer 150B containing a first material on the lower film 110.

The reactive gas 140 may be provided to the second reaction inhibiting layer 222 and the second precursor layer 232 and thus, a plurality of reaction inhibiting functional groups X chemisorbed on the lower film 110 by the reaction between the plurality of reaction inhibiting functional groups X constituting the second reaction inhibiting layer 222 and the reactive gas 140 may be desorbed, thus removing the second reaction inhibiting layer 222. At the same time, the second monolayer 150B of the plurality of reaction resultants R may be left remaining on the lower film 110 and the first monolayer 150A by the reaction between a plurality of precursor functional groups M constituting the second precursor layer 232 and the reactive gas 140. As a result, the thin film 150 including the first monolayer 150A and the second monolayer 150B may be formed on the lower film 110.

The thin film 150 including the second monolayer 150B may have a greater thickness than the first monolayer 150A. Also, as illustrated in dotted lines Q2 and Q3 of FIG. 7C, at least some portions of the second monolayer 150B may be deposited on the lower film 110 from the first monolayer 150A in a lateral direction, which is parallel to an extension direction of a main surface of the lower film 110 (X-Y planar surface). Therefore, the thin film 150 including the second monolayer 150B may have a greater width than the first monolayer 150A in a lateral direction.

Unnecessary resultants and compounds remained on the thin film 150 may be removed by a purge process. The purge process may be performed in the same manner as the purge process in process P26 of FIG. 3.

In an implementation, the process P32, the process P34, and the process P36 of FIG. 6 may be performed at least once for the resultant of FIG. 7C to form the thin film 150 to a desired thickness.

Figure 8:
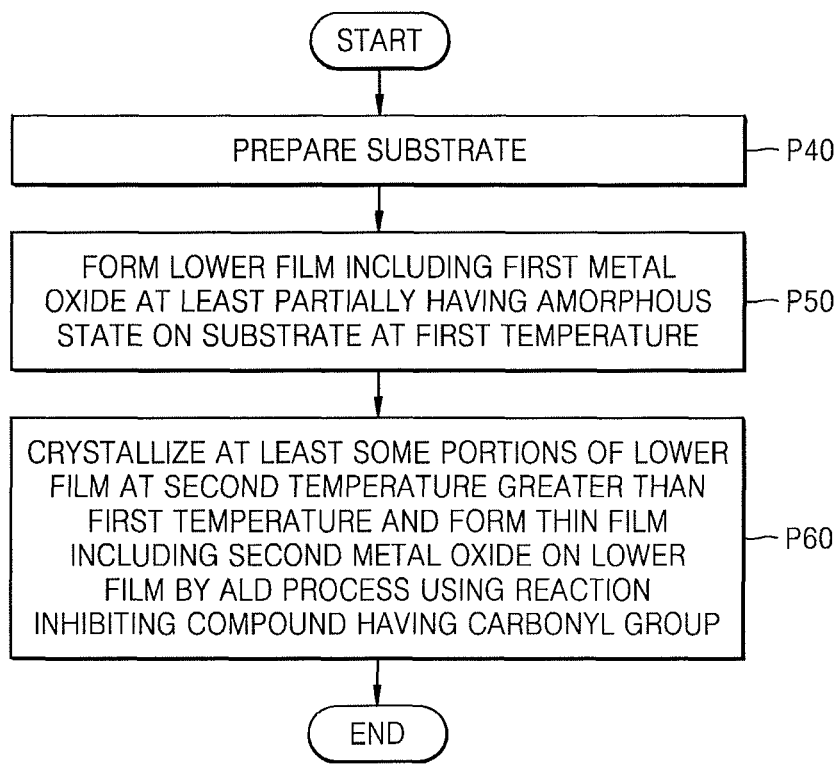
FIG. 8 illustrates a flowchart showing a thin film forming method according to another embodiment.
Figure 9A:
FIGS. 9A to 9C illustrate cross-sectional views of stages in the thin film forming method shown in FIG. 8 in more detail.
Figure 9B:
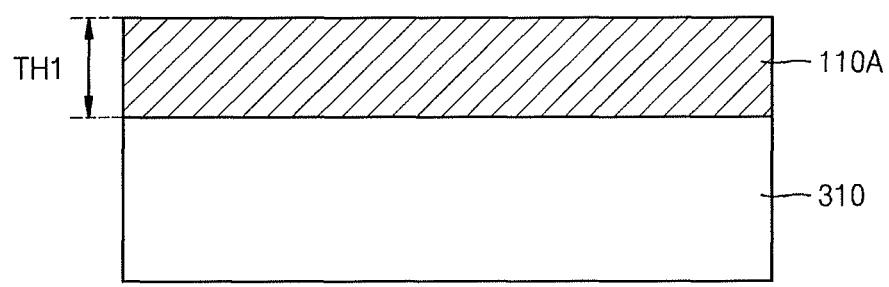
Figure 9C:
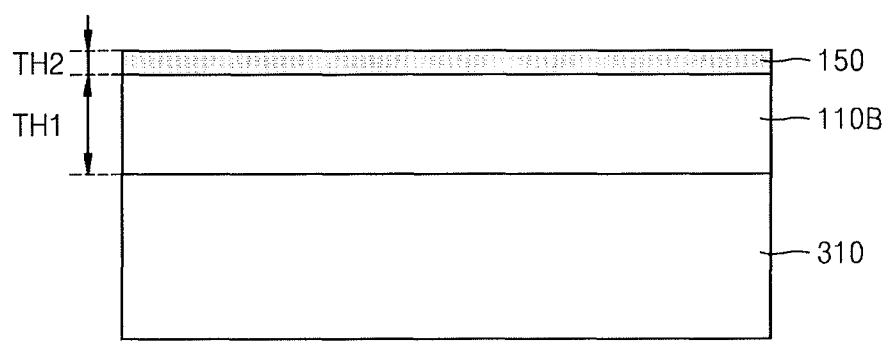

FIG. 8 illustrates a flowchart showing a thin film forming method according to another embodiment. FIGS. 9A to 9C illustrate cross-sectional views of stages in the thin film forming method described in FIG. 8.

Referring to FIG. 8 and FIG. 9A, in process P40, a substrate 310 is prepared.

In an implementation, the substrate 310 may include a semiconductor element such as Si and Ge or a compound semiconductor such as SiC, GaAs, InAs, and InP. In an implementation, the substrate 310 may include a semiconductor substrate, at least one insulating film formed on the semiconductor substrate, or structures including at least one conductive region.

Referring to FIGS. 8 and 9B, in process P50, a lower film 110A consisting of or including a first metal oxide at least partially in an amorphous state may be formed on the substrate 310 at a first temperature.

The first temperature may be lower than the crystallization temperature of the first metal oxide. For example, the first temperature may be selected from a range of about 200° C. to about 250° C. In an implementation, the first metal oxide may consist of $ZrO_2$, and the lower film 110A may include a $ZrO_2$ film. The first temperature may be lower than the crystallization temperature of the $ZrO_2$ film. The lower film 110A may have a first thickness TH1. The ALD process may be used to form the lower film 110A.

Referring to FIGS. 8 and 9C, in process P60, at least some portions of the lower film 110A of FIG. 9B may be crystallized to form a lower film 110B at a second temperature which is greater than the first temperature and thus, a thin film 150 consisting of or including a second metal oxide may be formed on the lower film 110B crystallized by the ALD process using a reaction inhibiting compound having a carbonyl group.

The second temperature may be selected from a range of about 300° C. to about 600° C.

The thin film 150 may have a second thickness TH2, which is less than the first thickness TH1 of the lower film 110B. To form the thin film 150, the method of forming the thin film 150 described with reference to FIGS. 1 and 2B, the method of forming the first monolayer 150A described with reference to FIG. 3 and FIGS. 4A to 4C or the method of forming the thin film 150 described with reference to FIG. 6 and FIGS. 7A to 7C may be performed.

In an implementation, the second metal oxide may consist of or include $Al_2O_3$. In an implementation, the thin film 150 of FIG. 9C may have a plurality of quantum dots shapes formed on the lower film 110B in a similar way to the first monolayer 150A of FIG. 5. The thin film 150 of FIG. 9C may have the same structure as the thin film 150 of FIG. 7C. In an implementation, the thin film 150 of FIG. 9C may be the thin film 150 having an increased thickness by performing the process P32, the process P34, and the process P36 of FIG. 6 at least once for the thin film 150 of FIG. 7C.

Figure 10:
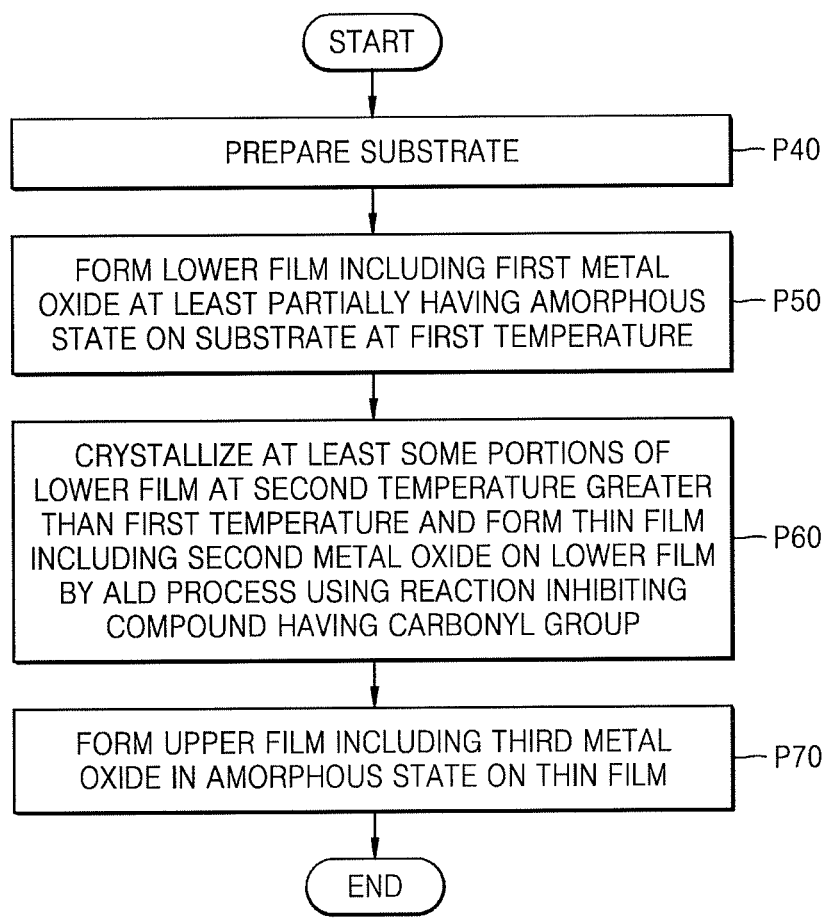
FIG. 10 illustrates a flowchart showing a thin film forming method according to another embodiment.
Figure 11:
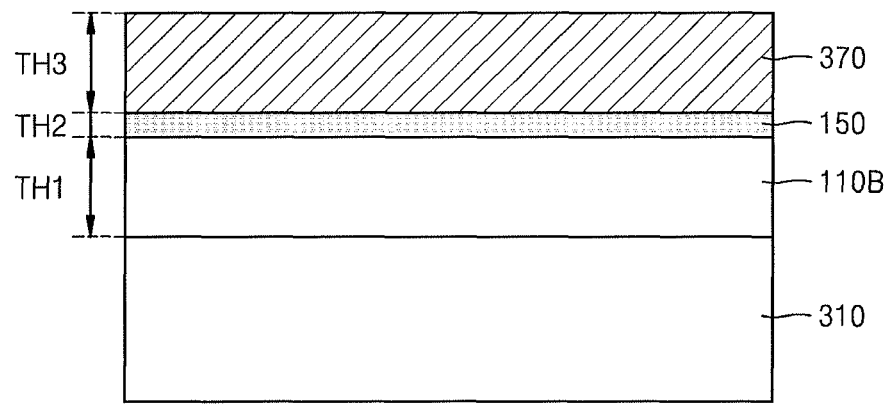
FIG. 11 illustrates a schematic view of some components in order to explain the thin film forming method described in FIG. 10 in more detail.

FIG. 10 illustrates a flowchart showing a thin film forming method according to another embodiment. FIG. 11 illustrates a schematic cross-sectional view showing some configurations to explain the thin film forming method of FIG. 10.

Referring to FIG. 10, process P40, process P50, and process P60 are performed in the same method as described with reference to FIG. 8 and FIGS. 9A to 9C, followed by forming the thin film 150 of FIG. 9C.

Referring to FIGS. 10 and 11, in process P70, an upper film 370 consisting of or including a third metal oxide may be formed on the thin film 150.

In an implementation, the third metal oxide constituting the upper film 370 may be composed of $ZrO_2$, and the upper film 370 may include an amorphous $ZrO_2$ film. The upper film 370 may have a third thickness TH3, which is greater than the second thickness TH2 of the thin film 150. The ALD process may be used to form the upper film 370.

Figure 12:
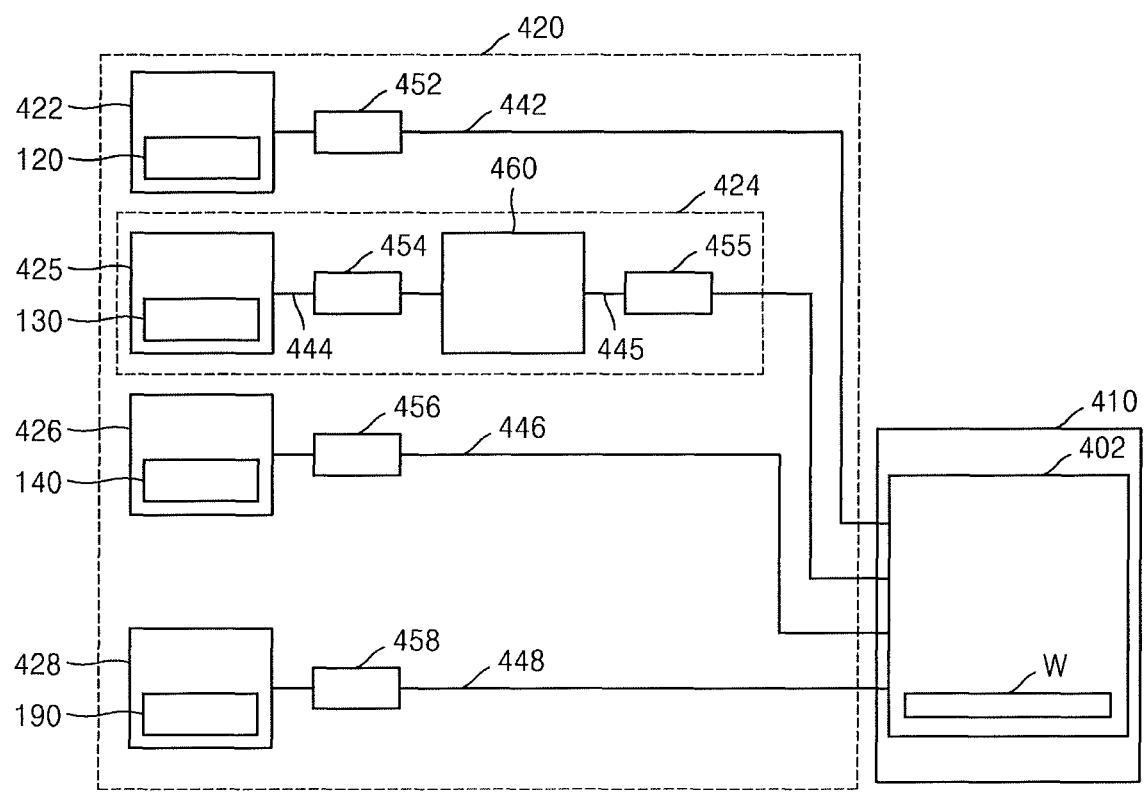
FIG. 12 illustrates a view showing a schematic configuration of an integrated circuit device manufacturing apparatus that may be used to perform a thin film forming method according to an embodiment.

FIG. 12 illustrates a view showing a schematic configuration of an integrated circuit device manufacturing apparatus 400 that may be used to perform a thin film forming method according to an embodiment.

Referring to FIG. 12, the integrated circuit device manufacturing apparatus 400 may include a substrate processing apparatus 410 having a reaction chamber 402 for processing at least one substrate W and a source supply system 420 for supplying materials necessary for processing the substrate W to the reaction chamber 402.

The source supply system 420 may be configured to supply the reaction inhibiting compound 120, the precursor 130, the reactive gas 140, and a purge gas 190 into the reaction chamber 402, each being supplied independently and at different times. In an implementation, the source supply system 420 may be configured to simultaneously supply at least two of the reaction inhibiting compound 120, the precursor 130, the reactive gas 140, and the purge gas 190 into the reaction chamber 402. The reaction chamber 402 may be a chamber in which at least one substrate W may be loaded and unloaded.

The source supply system 420 may include a first supply apparatus 422 for supplying the reaction inhibiting compound 120, a second supply apparatus 424 for supplying the precursor 130, a third supply apparatus 426 for supplying the reactive gas 140, and a fourth supply apparatus 428 for supplying the purge gas 190.

The reaction inhibiting compound 120 stored in the first supply apparatus 422 may be supplied from the first supply apparatus 422 into the reaction chamber 402 through a pipe 442. A flow control apparatus 452 capable of controlling the flow of the reaction inhibiting compound 120 may be provided along the pipe 442 between the first supply apparatus 422 and the reaction chamber 402.

The second supply apparatus 424 may include a precursor storage container 425 and a vaporizer 460. The precursor storage container 425 and the vaporizer 460 may be connected by a pipe 444, and the pipe 444 may include a flow control apparatus 454. The vaporizer 460 and the reaction chamber 402 may be connected by a pipe 445, and the pipe 445 may include a flow control apparatus 455. The precursor 130 in the precursor storage container 425 may be supplied to the vaporizer 460 and vaporized in the vaporizer 460, followed by being supplied to the reaction chamber 402.

The reactive gas 140 stored in the third supply apparatus 426 may be supplied into the reaction chamber 402 through a pipe 446. A flow control apparatus 456 capable of controlling the flow of the reactive gas 140 may be provided to the pipe 446.

The purge gas 190 stored in the fourth supply apparatus 428 may be provided into the reaction chamber 402 through a pipe 448. A flow control apparatus 458 capable of controlling the flow of the purge gas 190 may be provided to the pipe 448.

Fluids may flow through a plurality of pipes 442, 444, 445, 446, and 448 included in the source supply system 420. A plurality of flow control apparatuses 452, 454, 455, 456, and 458 may include a valve system capable of controlling the flow of the fluid.

Figure 13:
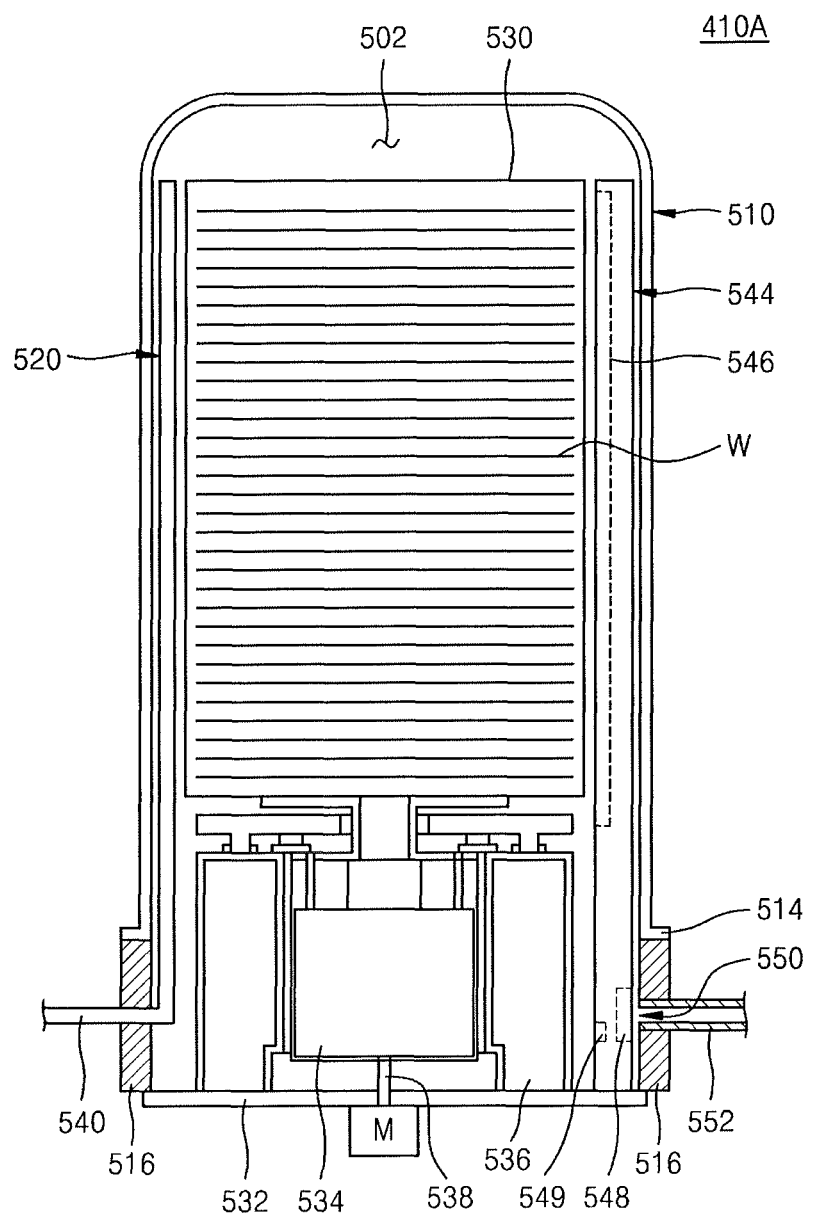
FIG. 13 illustrate a cross-sectional view of a substrate processing apparatus included in an integrated circuit device manufacturing apparatus that may be used to perform a thin film forming method according to an embodiment.

FIG. 13 illustrates a cross-sectional view for more specifically illustrating an exemplary configuration of the substrate processing apparatus 410 of FIG. 12. FIG. 13 illustrates a main configuration of a substrate processing apparatus 410A including a reaction tube 510 in a batch type capable of simultaneously performing an ALD process on a plurality of substrates W.

Referring to FIG. 13, the substrate processing apparatus 410A may include the reaction tube 510 for providing a reaction chamber 502, which is a space for processing a plurality of substrates W and an injector 520 for injecting fluids necessary for a thin film formation to the plurality of substrates W in the reaction tube 510. A boat 530 for supporting the plurality of substrates W may be installed in the reaction tube 510.

The reaction tube 510 may include a lower open end and an upper closed end. The lower open end of the reaction tube 510 may include a flange 514 protruding radially and outwardly from the reaction tube 510. The flange 514 may be mounted onto the supporting unit 516 and seal the reaction tube 510 with the supporting unit 516 using a sealing member such as an O-ring. The reaction tube 510 may extend upward from the supporting unit 516 in a vertical direction.

The reaction chamber 502 may be maintained at a desired temperature by a temperature control system arranged to surround the reaction tube 510. The reaction tube 510 may include quarts. The boat 530 included in the reaction chamber 502 may be supported by a door plate 532. In the substrate processing apparatus 410A, the door plate 532 may be installed to move up and down so that the boat 530 may be drawn into or out of the reaction tube 510. A boat cap 534 supporting the boat 530 may be installed at a lower portion of the boat 530. The boat cap 534 may serve as a heat sink. The boat 530 may be configured to include about 20 to 40 substrates W. The door plate 532 may seal the reaction tube 510 with a sealing member such as an O-ring at a lower portion of the reaction tube 510. The cap plate 536 surrounding the boat cap 534 may be disposed on the door plate 532. The cap plate 536 may prevent process gas or process byproducts in the reaction tube 510 from flowing between the supporting unit 516 and the cap plate 536.

A rotary shaft 538 may be installed at the lower portion of the boat 530 and may be connected to a motor M provided at an outer side of the door plate 532. The boat 530 may be rotatably supported within the reaction tube 510 using the rotary shaft 538. While the ALD process for forming the thin film required for the substrate processing apparatus 410A is performed, the boat 530 may be rotated at a predetermined speed by the motor M and the rotary shaft 538 and thus the gases necessary for forming the thin film may be injected onto the plurality of substrates W in the reaction chamber 502.

A gas introducing pipe 540 may extend from the lower portion of the reaction tube 510 into the supporting unit 516. The gas introducing pipe 540 may be connected to the source supply system 420 of FIG. 12. Fluids supplied from the source supply system 420, for example, the reaction inhibiting compound 120, the precursor 130, the reactive gas 140, and the purge gas 190 may be flowed into the reaction chamber 502 through the gas introducing pipe 540.

Gases introduced into the reaction chamber 502 through the gas introducing pipe 540, for example, the reaction inhibiting compound 120, the precursor 130, the reactive gas 140, and the purge gas 190 may be supplied to the injector 520. The injector 520 may have a plurality of ejection openings for ejecting the introduced gases onto the plurality of substrates W. Gases necessary for thin film formation may be ejected toward a center of the reaction tube 510 through the plurality of ejection openings in a direction parallel to each main surface of the plurality of substrates W. The injector 520 may include quartz, stainless steel or an alloy.

An exhaust guide 544 is installed in the reaction tube 510. The exhaust guide 544 may provide an exhaust passage for collecting and discharging the gases, which went through the boat 530. The exhaust guide 544 may include quartz. The exhaust guide 544 may be spaced apart from an outer circumferential surface of the boat 530 and also spaced apart from an inner circumferential surface of the reaction tube 510. The exhaust guide 544 may include a plurality of exhaust slits 546 arranged along an extension direction of the reaction tube 510 and a discharging outlet 548 for discharging gases introduced to the exhaust guide 544 through the plurality of exhaust slits 546. The exhaust guide 544 may further include an exhaust hole 549 for exhausting the gas in a lower portion of the reaction tube 510 and an inner portion of the supporting unit 516.

The substrate processing apparatus 410A may include an exhaust unit 550 for exhausting the gas inside the reaction tube 510. The exhaust unit 550 may include an exhaust outlet 552 that communicates with an inner space of the reaction tube 510. The exhaust outlet 552 may be formed to pass through the supporting unit 516. Gases in the reaction chamber 502, which have been supplied onto the plurality of substrates W, are introduced to the exhaust guide 544 through an exhaust slit 546 and discharged to the outside of the exhaust guide 544 through the discharging outlet 548. The gas discharged from the exhaust guide 544 may be discharged to the outside of the substrate processing apparatus 410A through the exhaust outlet 552.

The substrate processing apparatus 410A may further include a pressure adjusting apparatus for adjusting a pressure in the reaction tube 510. The pressure adjusting apparatus may be connected to the exhaust outlet 552 and include a pump for reducing the pressure in the reaction tube 510.

Figure 14:
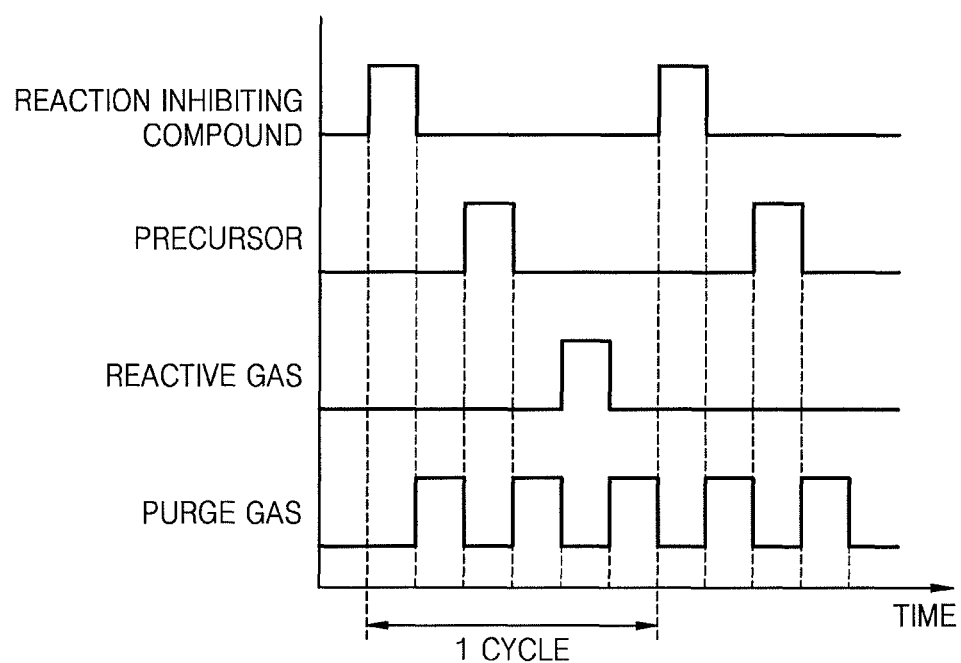
FIG. 14 and FIGS. 15A to 15D illustrate gas supply timing diagrams that may be applied to a thin film forming method according to an embodiment.

FIG. 14 illustrates a supply timing diagram of supply gases that may be applied to the thin film forming method described with reference to FIGS. 1 to 11.

Referring to FIG. 14, as described with reference to process P22 of FIG. 3 and FIG. 4A, the reaction inhibiting compound 120 may be supplied to a reaction chamber, e.g., the reaction chamber 502 of FIG. 13, to form the first reaction inhibiting layer 122 chemisorbed onto the lower film 110, followed by supplying a purge gas to discharge unnecessary materials on the lower film 110 to the outside.

Next, as described with reference to process P24 of FIG. 3 and FIG. 4B, the precursor 130 may be supplied on the lower film 110 to form the first precursor layer 132 consisting of the plurality of precursor functional groups M chemisorbed on the lower film 110, followed by supplying a purge gas to discharge unnecessary materials on the lower film 110 to the outside.

Then, as described with reference to process P26 of FIG. 3 and FIG. 4C, the reactive gas 140 may be supplied to the first precursor layer 132 to remove the first reaction inhibiting layer 122 from the lower film 110 and form the first monolayer 150A on the lower film 110, followed by supplying a purge gas to discharge unnecessary materials on the lower film 110 to the outside.

The ALD process having the aforementioned processes performed in one cycle may be repeated at least once for the first monolayer 150A being formed so that the thin film 150 (see FIGS. 7C and 9C) having a desired thickness may be formed.

FIGS. 15A to 15D illustrate gas supply timing diagrams for describing other embodiments of the cycle of the ALD process in FIG. 14.

Figure 15A:
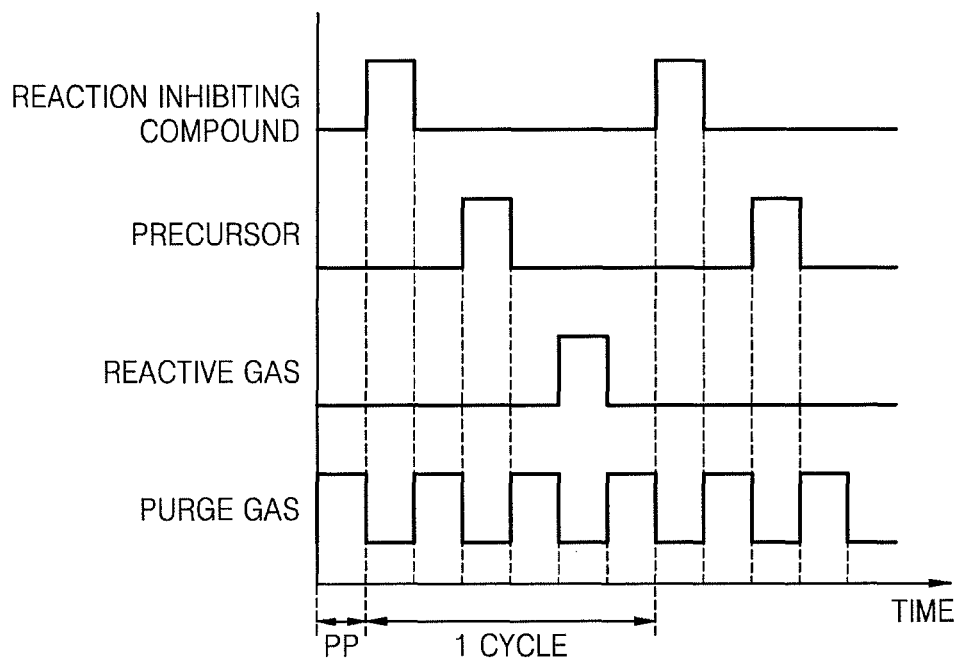

The gas supply timing diagram of FIG. 15A is substantially the same as described with reference to FIG. 14, except that, in the ALD process for forming the first monolayer 150A of FIG. 4C or the thin film 150 of FIG. 7C or 9C, the purge gas may be supplied on the lower film 110 to further perform a preliminary purge process (PP) for removing unnecessary materials on the lower film 110 before performing the ALD process of one cycle as described with reference to FIG. 14.

Figure 15B:
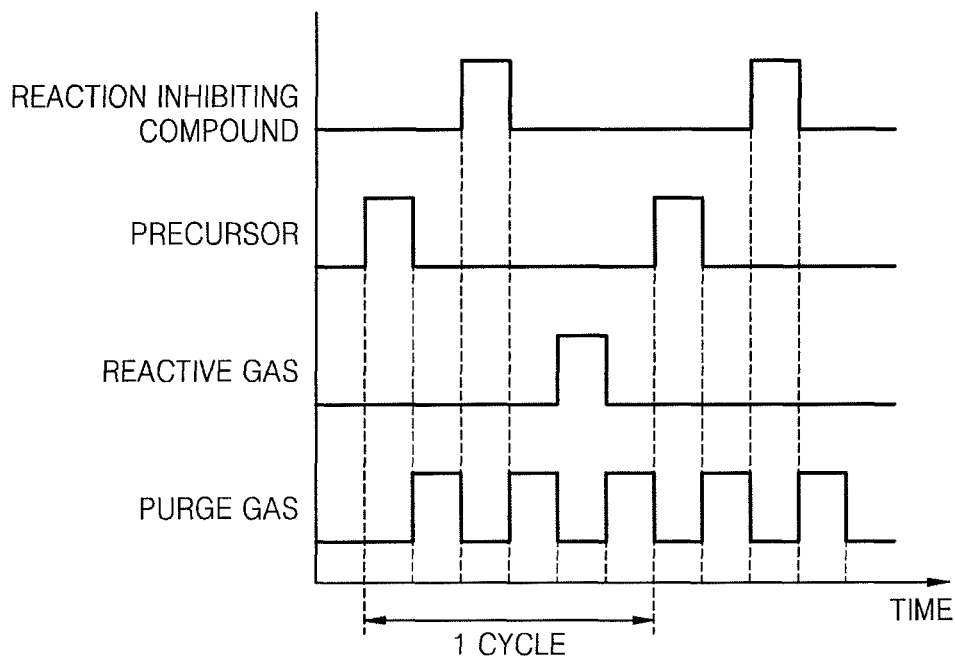

The gas supply timing diagram of FIG. 15B is substantially the same as described with reference to FIG. 14, except that a supply timing of the reaction inhibiting compound 120 and a supply timing of the precursor 130 may be changed from each other, e.g., reversed.

Figure 15C:
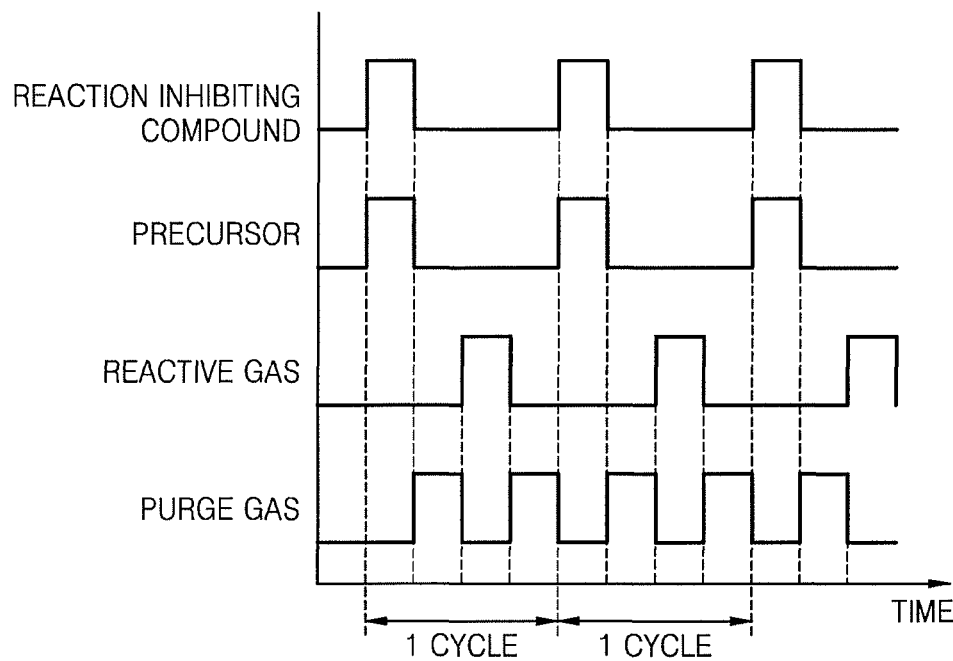

The gas supply timing diagram of FIG. 15C is substantially the same as described with reference to FIG. 14 except that a supply of the reaction inhibiting compound 120 and a supply of the precursor 130 may be simultaneously performed.

Figure 15D:
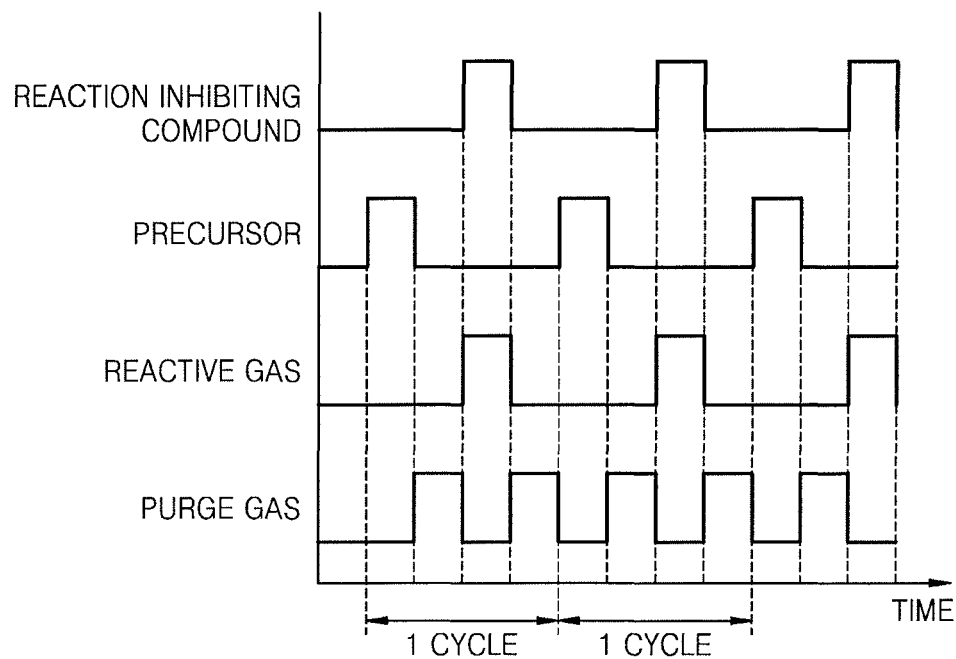

The gas supply timing diagram of FIG. 15D is substantially the same as described with reference to FIG. 14 except that a supply of the reaction inhibiting compound 120 and a supply the reactive gas 140 may be simultaneously performed.

In the thin film forming method according to an embodiment, a thin film may be formed by any one ALD process of ALD processes based on the gas supply timing diagrams of FIGS. 15A to 15D. An ALD process repeating, at least once, a cycle according to any one of the gas supply timing diagrams of FIG. 14 and FIGS. 15A to 15D is performed for the resultant where the first monolayer 150A is formed of FIG. 4C, whereby the thin film 150 having a desired thickness (see FIGS. 7C and 9C) may be formed.

According to the thin film forming method described with reference to FIGS. 1 to 15D, a thin film having a dense structure and a thickness less than a thickness of a monolayer obtained by other ALD processes may be formed without impurities, and it may also be easy to control a thickness of a desired thin film, as well as a thickness uniformity and step coverage of a thin film.

FIGS. 16A to 16J illustrate cross-sectional views of stages in a method of manufacturing an integrated circuit device 600 (see FIG. 16J) according to embodiments.

Figure 16A:
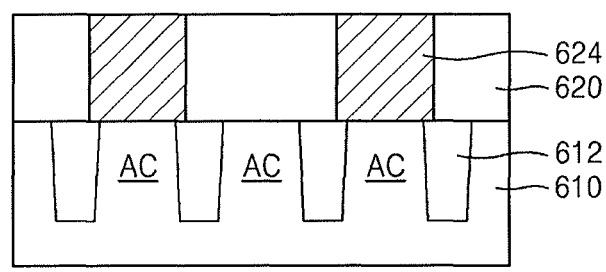
FIGS. 16A to 16J illustrate cross-sectional views of stages in a method of manufacturing an integrated circuit device according to embodiments.
Figure 16A:
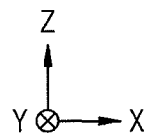

Referring to FIG. 16A, an interlayer dielectric 620 may be formed on a substrate 610 including a plurality of active regions AC, followed by forming a plurality of conductive regions 624, which penetrate the interlayer dielectric 620 and are respectively connected to the plurality of active regions AC.

The substrate 610 may have substantially the same configuration as the substrate 310 of FIG. 9A. The plurality of active regions AC may be defined by a plurality of device isolation regions 612. The interlayer dielectric 620 may include a silicon oxide film. The plurality of conductive regions 624 may include polysilicon, a metal, a conductive metal nitride, a metal silicide, or a combination thereof.

Figure 16B:
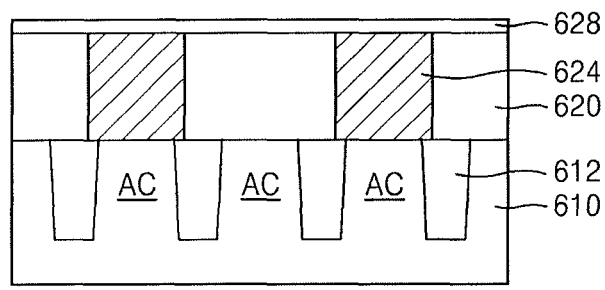
Figure 16B:
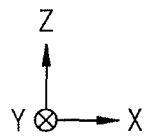

Referring to FIG. 16B, an insulating layer 628 may be formed and covers the interlayer dielectric 620 and the plurality of conductive regions 624. The insulating layer 628 may include a silicon nitride, a silicon oxynitride, or a combination thereof.

Figure 16C:
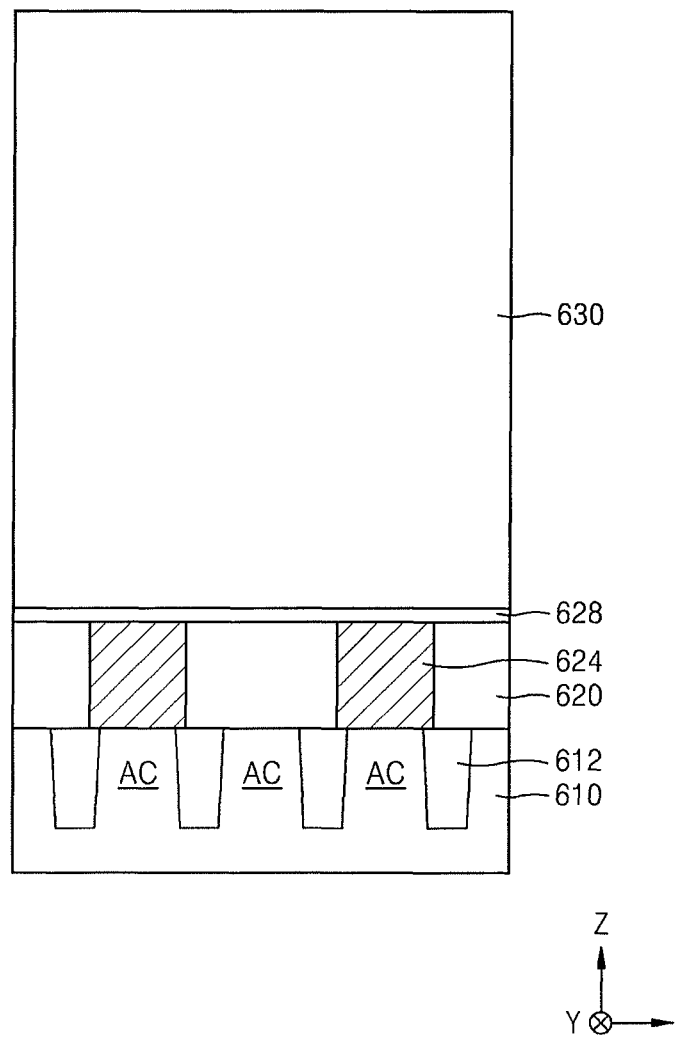

Referring to FIG. 16C, a mold film 630 may be formed on the insulating layer 628. The mold film 630 may include an oxide film.

Figure 16D:
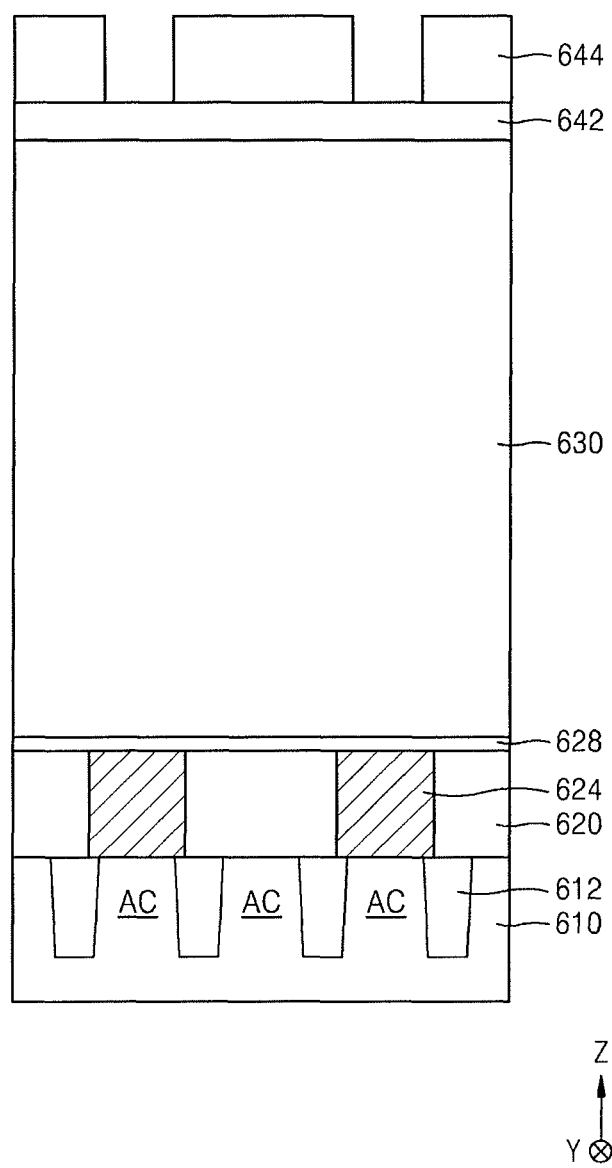

Referring to FIG. 16D, a sacrificial film 642 and a mask pattern 644 may be formed on the mold film 630 in this stated order. The sacrificial film 642 may include an oxide film. The sacrificial film 642 protects a support film included in the mold film 630. The mask pattern 644 may include an oxide film, a nitride film, a polysilicon film, a photoresist film, or a combination thereof.

Figure 16E:
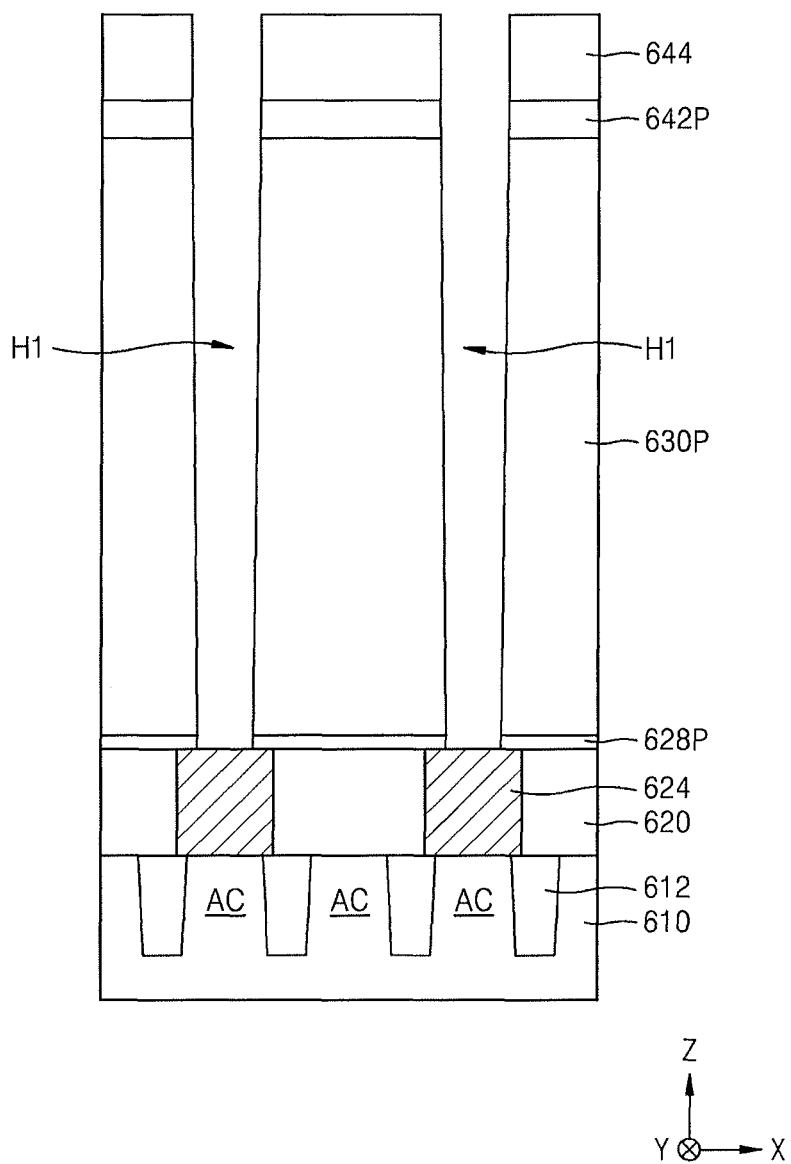

Referring to FIG. 16E, the sacrificial film 642 and the mold film 630 may be dry-etched by using the mask pattern 644 as an etch mask and using the insulating layer 628 as an etch stop layer, thereby forming a sacrificial pattern 642P and a mold pattern 630P, which define a plurality of holes H1. Here, the insulating layer 628 may also be etched due to over-etch, whereby an insulating pattern 628P may be formed and expose the plurality of conductive regions 624.

Figure 16F:
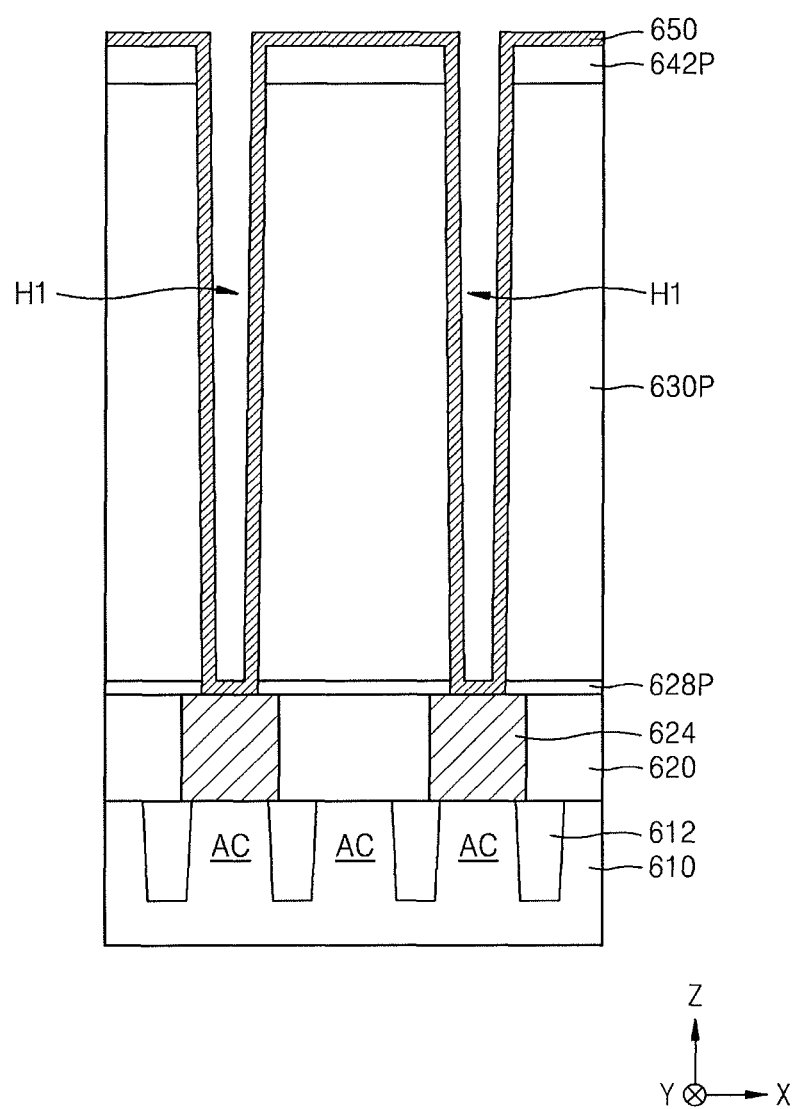

Referring to FIG. 16F, the mask pattern 644 may be removed from the resultant of FIG. 16E, followed by forming a lower electrode-forming conductive film 650, which covers an inner sidewall of each of the plurality of holes H1, an exposed surface of the insulating pattern 628P, an exposed surface of each of the plurality of conductive regions 624 inside the plurality of holes H1, and an exposed surface of the sacrificial pattern 642P.

The lower electrode-forming conductive film 650 may include a doped semiconductor, a conductive metal nitride, a metal, a metal silicide, a conductive oxide, or a combination thereof. For example, the lower electrode-forming conductive film 650 may include TiN, TiAlN, TaN, TaAlN, W, WN, Ru, $RuO_2$, $SrRuO_3$, Ir, $IrO_2$, Pt, PtO, BSRO ((Ba,Sr)$RuO_3$), CRO ($CaRuO_3$), or LSCo ((La,Sr)$CoO_3$). To form the lower electrode-forming conductive film 650, CVD, metal organic CVD (MOCVD), or ALD process may be used.

Figure 16G:
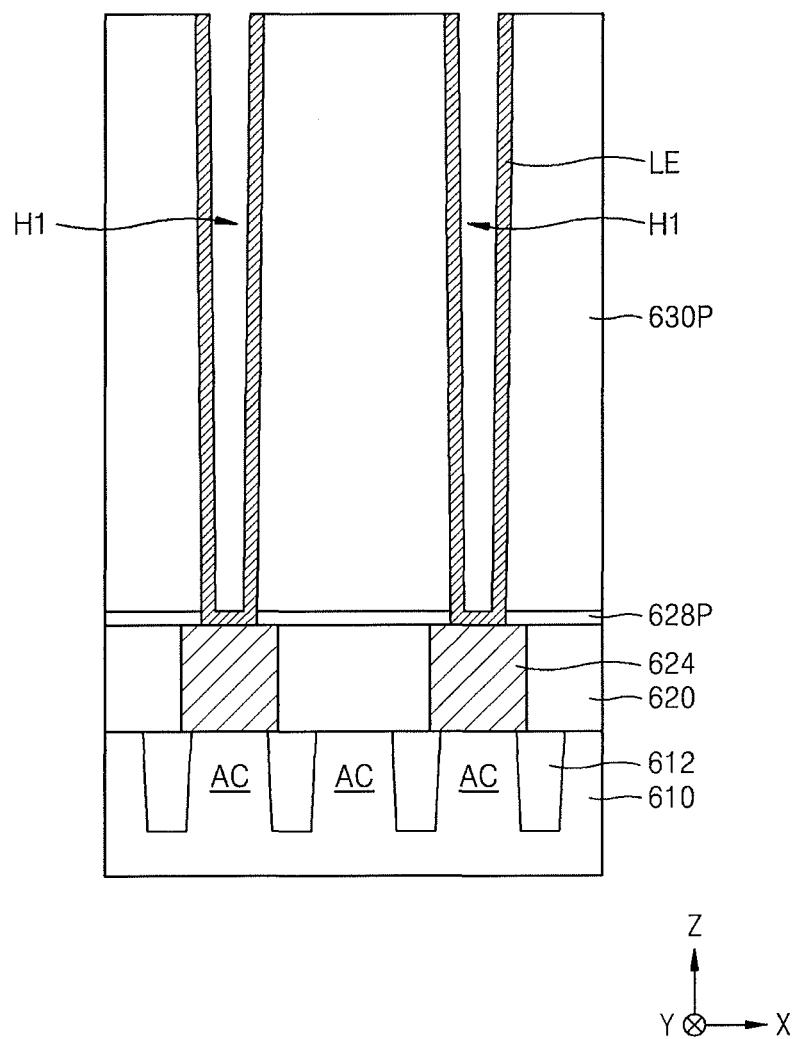

Referring to FIG. 16G, an upper side of the lower electrode-forming conductive film 650 may be partially removed, thereby dividing the lower electrode-forming conductive film 650 into a plurality of lower electrodes LE.

To form the plurality of lower electrodes LE, a portion of the upper side of the lower electrode-forming conductive film 650 and the sacrificial pattern 642P (see FIG. 16F) may be removed by using an etchback or chemical mechanical polishing (CMP) process.

Figure 16H:
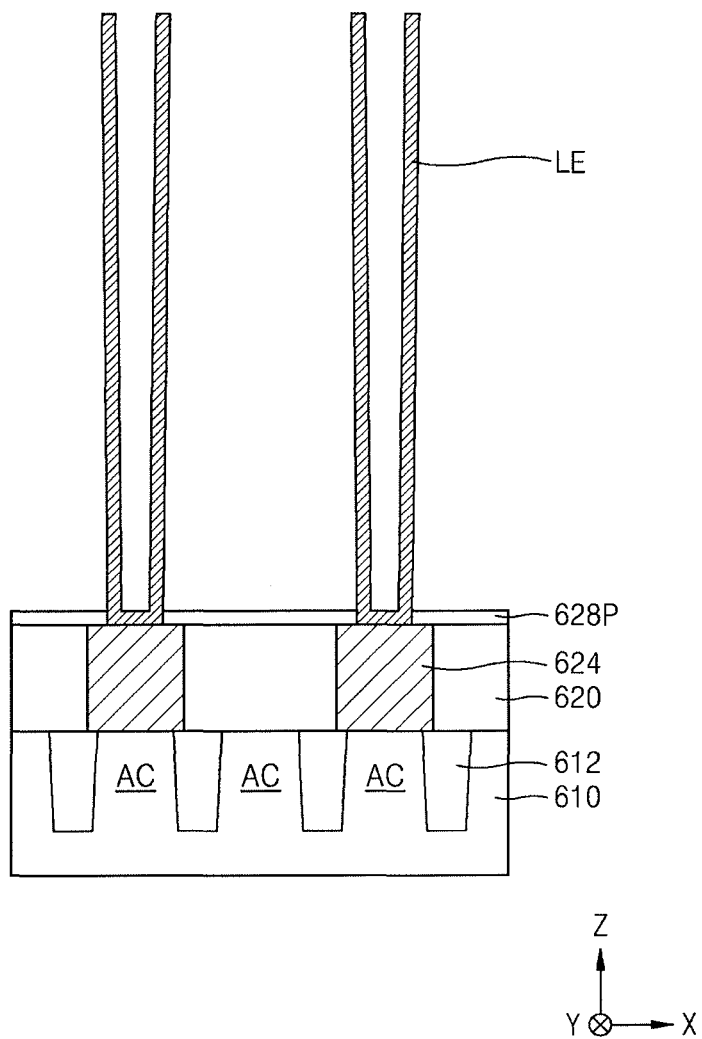

Referring to FIG. 16H, the mold pattern 630P may be removed, thereby exposing outer walls of the plurality of lower electrodes LE having cylindrical shapes.

Figure 16I:
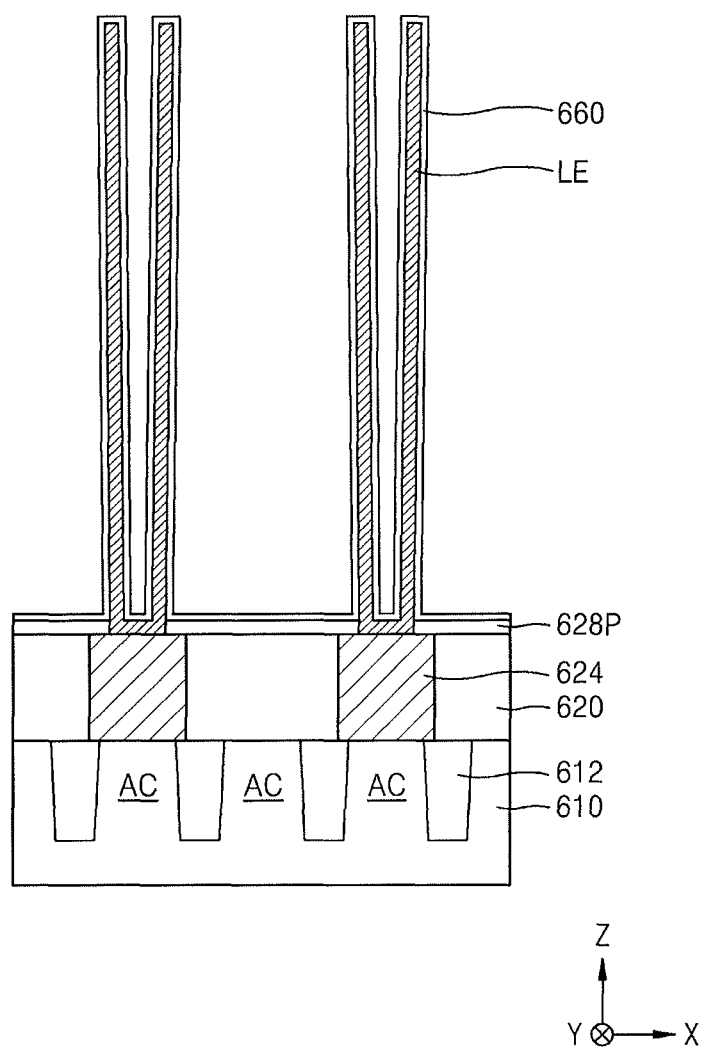

Referring to FIG. 16I, a dielectric film 660 may be formed on the plurality of lower electrodes LE.

The dielectric film 660 may conformally cover exposed surfaces of the plurality of lower electrodes LE. The dielectric film 660 may be formed by an ALD process. To form the dielectric film 660, at least one method from among the methods described with reference to FIGS. 1 to 15D may be used.

The dielectric film 660 may include an aluminum oxide film. In an implementation, the dielectric film 660 may include a single layer of an aluminum oxide film, or may include a combination of at least one aluminum oxide film and at least one high-K dielectric film selected from a tantalum oxide film and a zirconium oxide film. For example, the dielectric film 660 may have a multi-layered structure including a $ZrO_2/Al_2O_3/ZrO_2$ laminated structure, or a $ZrO_2/Al_2O_3/ZrO_2/Al_2O_3$ laminated structure. The dielectric film 660 may have a thickness of about 50 Å to about 150 Å. In an implementation, an aluminum oxide film constituting the dielectric film 660 may have a thickness of about 0.2 Å to about 1.5 Å. The ALD process for forming the dielectric film 660 may be performed at about 300° C. to about 600° C.

In an implementation, after the formation of the dielectric film 660, the dielectric film 660 may be annealed at a temperature of about 500° C. to about 1,150° C.

Figure 16J:
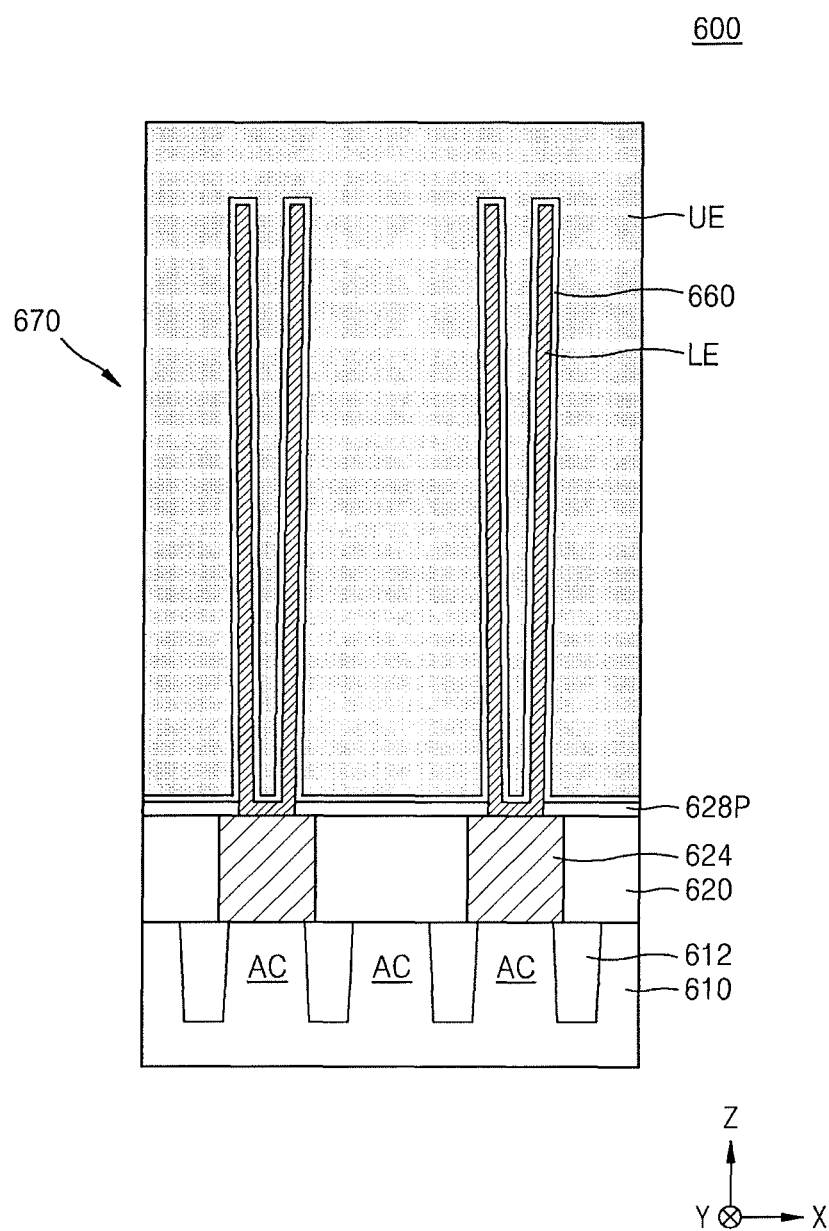

Referring to FIG. 16J, an upper electrode UE may be formed on the dielectric film 660. The lower electrode LE, the dielectric film 660, and the upper electrode UE may constitute a capacitor 670.

The upper electrode UE may include a doped semiconductor, a conductive metal nitride, a metal, a metal silicide, a conductive oxide, or a combination thereof. To form the upper electrode UE, a CVD, MOCVD, PVD, or ALD process may be used.

In the method of manufacturing the integrated circuit device 600, which has been described with reference to FIGS. 16A to 16J, a pillar-type lower electrode having no inner space may be formed instead of the cylindrical lower electrode LE.

In the method of manufacturing the integrated circuit device 600 according to an embodiment, which has been described with reference to FIGS. 16A to 16J, the capacitor 670 may include the lower electrode LE having a 3-dimensional electrode structure in order to increase capacitance of the capacitor 670. To compensate for reduction in capacitance due to reduction of a design rule, an aspect ratio of the 3-dimensional structured lower electrode LE may be increased. According to the method of manufacturing the integrated circuit device according to an embodiment, when the dielectric film 660 is formed on the lower electrode LE by an ALD process, by using the thin film forming method according to an embodiment, the dielectric film 660 consisting of a thin film having a dense structure and a thickness less than a thickness of a monolayer obtained by other ALD processes may be uniformly formed on the lower electrode LE of a three-dimensional structure having a relatively large aspect ratio.

In addition, an amount of impurities remained in the dielectric film 660 may be reduced, thereby improving the electric characteristics and reliability of the integrated circuit device 600 including the dielectric film 660.

FIGS. 17A to 17H illustrate cross-sectional views of stages in a method of manufacturing an integrated circuit device according to another embodiments. Referring to FIGS. 17A to 17H, a method of manufacturing an integrated circuit device 700 (see FIG. 17H) constituting a vertical non-volatile memory device will be described.

Figure 17A:
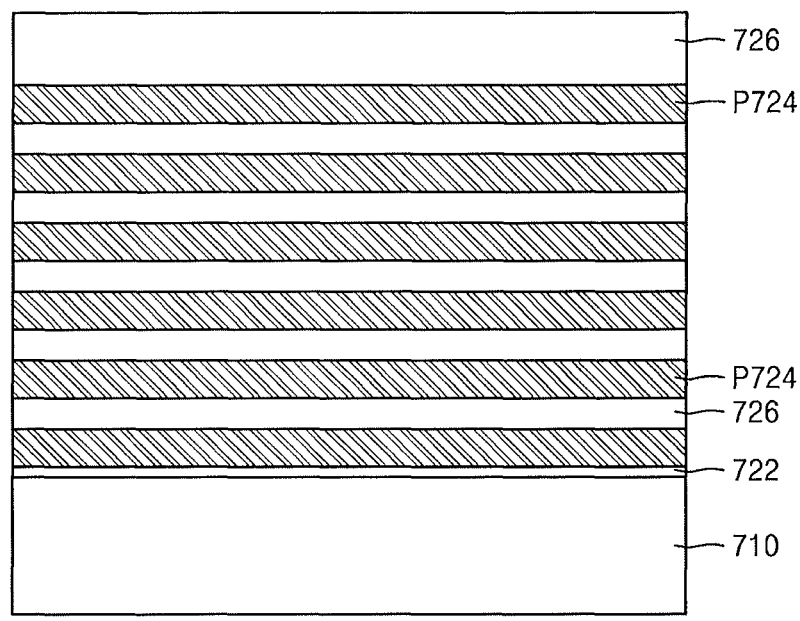
FIGS. 17A to 17H illustrate cross-sectional views of stages in a method of manufacturing an integrated circuit device according to other embodiments.

Referring to FIG. 17A, an etch stop insulating film 722 may be formed on a substrate 710, and a plurality of sacrificial layers P724 and a plurality of insulating layers 726 may be alternately stacked on the etch stop insulating film 722, layer by layer. A thickness of the uppermost insulating layer 726 may be greater than a thickness of another insulating layer 726.

The substrate 710 may have substantially the same configuration as the substrate 310 of FIG. 9A. The etch stop insulating film 722 and the plurality of insulating layers 726 may be an insulating material, for example, a silicon oxide. The plurality of sacrificial layers P724 may include a silicon nitride film, a silicon oxynitride film, a polysilicon film, or a polysilicon germanium film.

Figure 17B:
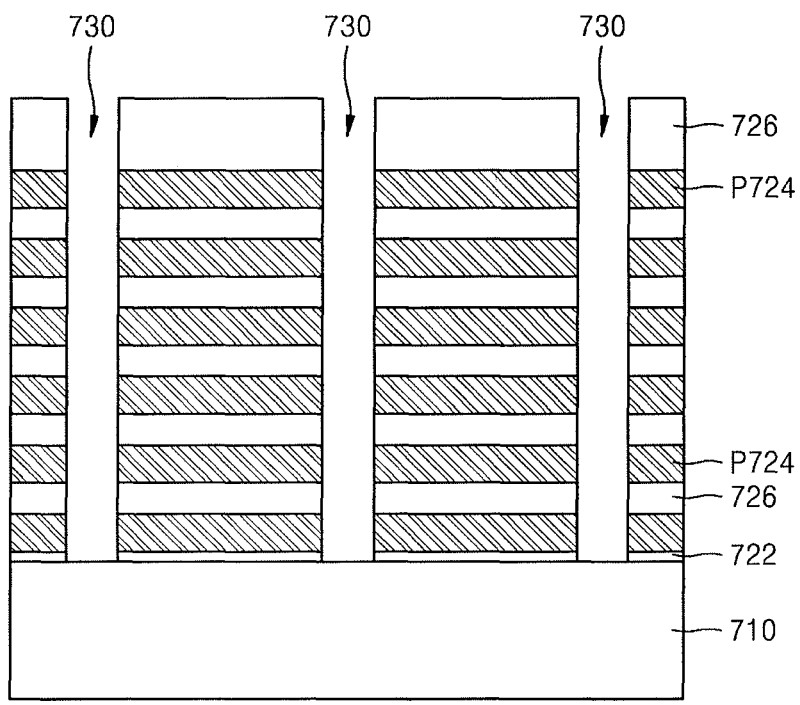

Referring to FIG. 17B, a plurality of channel holes 730 may be formed through the plurality of insulating layers 726, the plurality of sacrificial layers P724, and the etch stop insulating film 722.

Figure 17C:
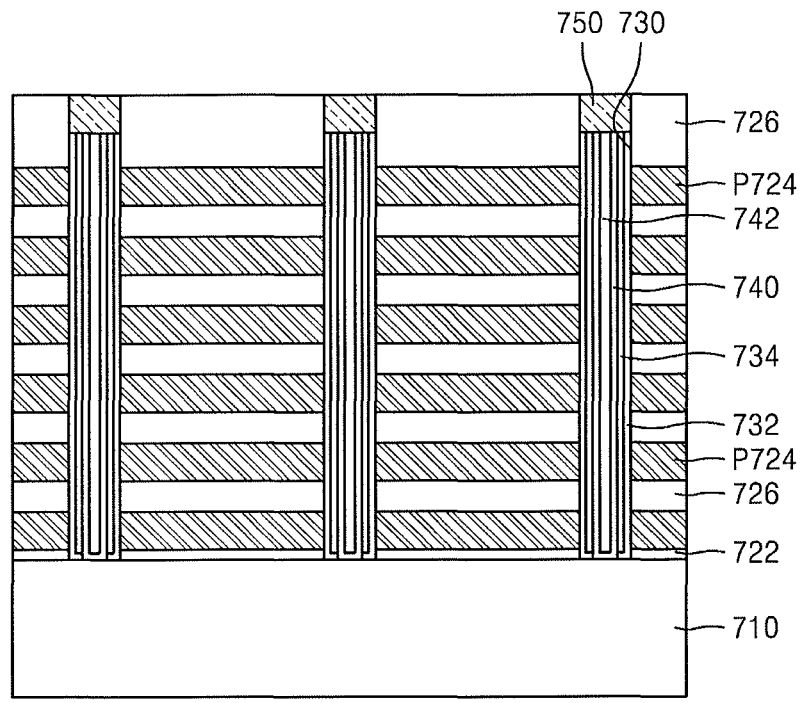

Referring to FIG. 17C, a charge storage film 732, a tunnel dielectric film 734, and a channel region 740 may be formed in this stated order and sequentially cover an inner wall of each of the plurality of channel holes 730.

The charge storage film 732 may include a silicon nitride film. The tunnel dielectric film 734 may include a silicon oxide film. The channel region 740 may include a semiconductor film, for example, a Si film. An insulating film 742 may fill a space remaining above the channel region 740 in each channel hole 730.

The charge storage film 732, the tunnel dielectric film 734, the channel region 740, and the insulating film 742 may be partially removed to form an upper space in each of the plurality of channel holes 730, and a conductive pattern 750 may fill the upper space. The conductive pattern 750 may include doped polysilicon. The conductive pattern 750 may be used as a drain region.

Figure 17D:
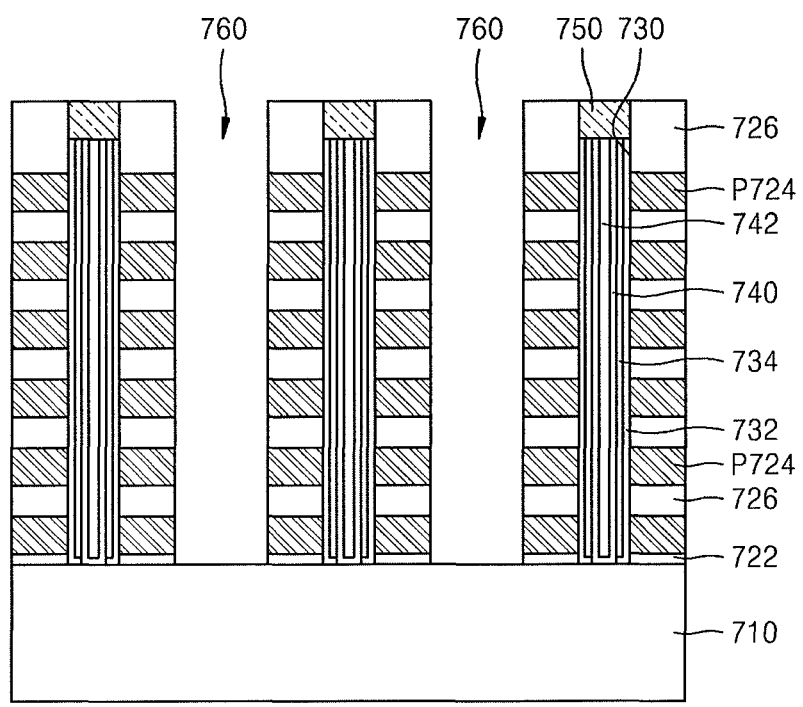

Referring to FIG. 17D, a plurality of openings 760 may be formed through the plurality of insulating layers 726, the plurality of sacrificial layers P724, and the etch stop insulating film 722 and expose the substrate 710. Each of the plurality of openings 760 may be a word line cut region.

Figure 17E:
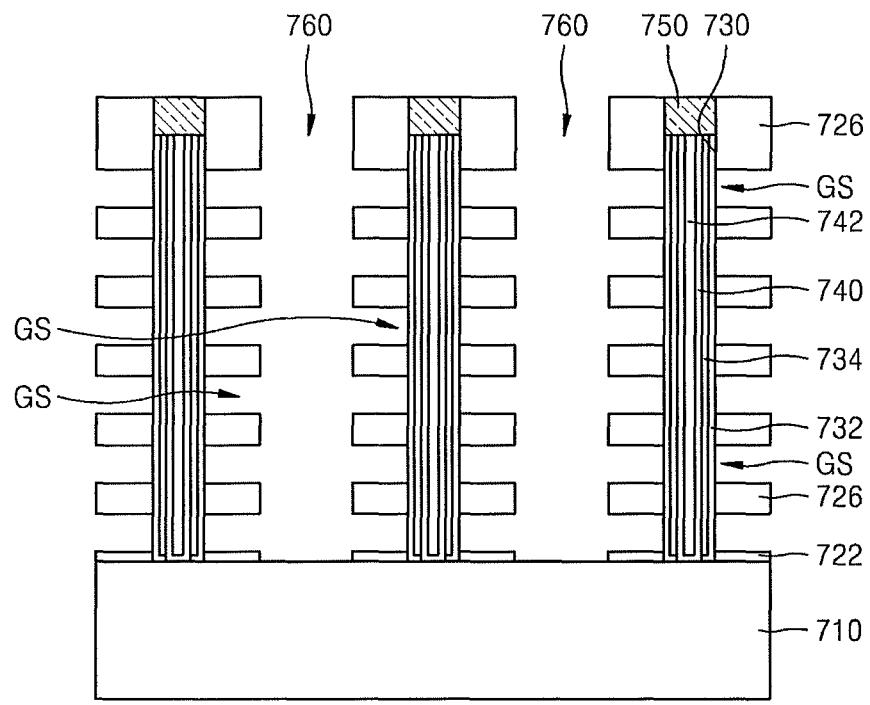

Referring to FIG. 17E, the plurality of sacrificial layers P724 may be removed from the plurality of openings 760, thereby forming a plurality of gate spaces GS each between two of the plurality of insulating layers 726. The charge storage film 732 may be exposed through the plurality of gate spaces GS.

Figure 17F:
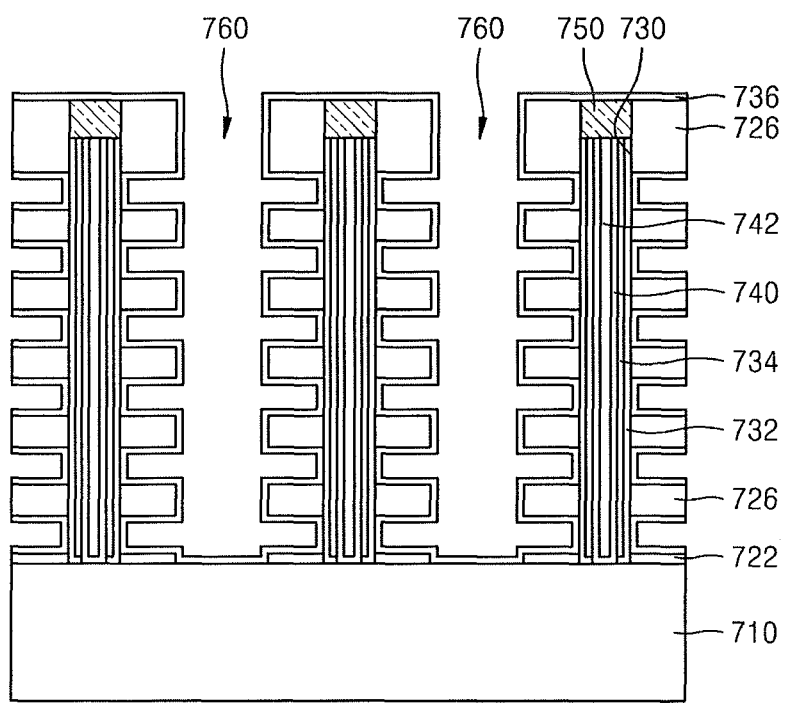

Referring to FIG. 17F, a blocking insulating film 736 may be formed and cover inner walls of the plurality of gate spaces GS (see FIG. 17E).

The blocking insulating film 736 may be formed by the ALD process. To form the blocking insulating film 736, at least one method from among the thin film-forming methods described with reference to FIGS. 1 to 15D may be used. The blocking insulating film 736 may include an aluminum oxide film. In an implementation, the blocking insulating film 736 may include a single film of an aluminum oxide film or a combination of at least one aluminum oxide film and at least one high-K dielectric film selected from a tantalum oxide film and a zirconium oxide film. The ALD process for forming the blocking insulating film 736 may be performed at a temperature of about 300° C. to about 600° C.

Figure 17G:
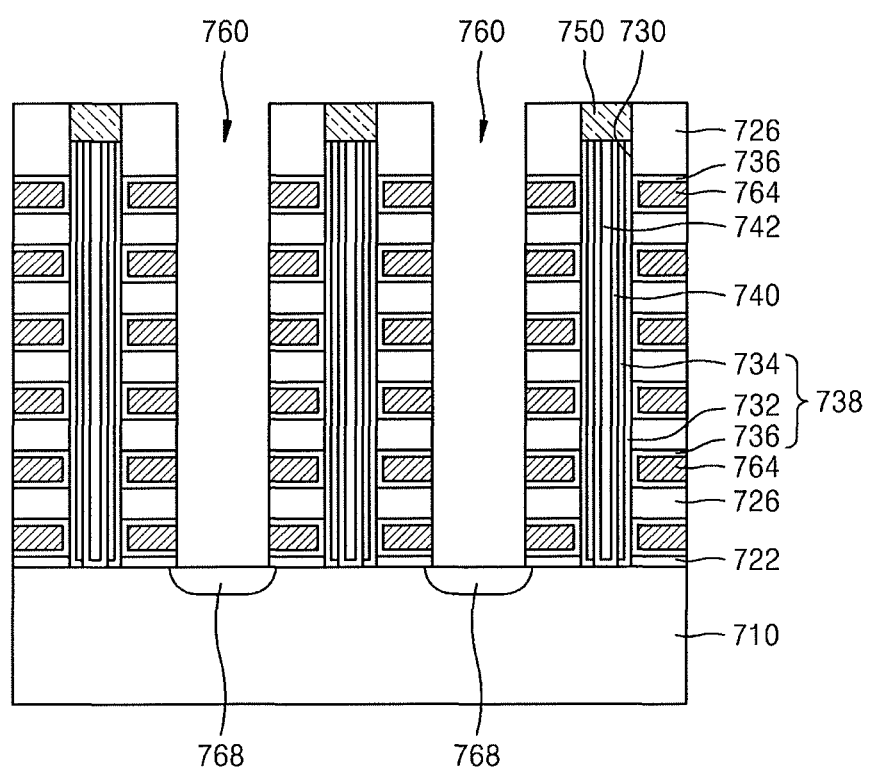

Referring to FIG. 17G, a conductive layer for gate electrodes may be formed and may fill spaces surrounded by the blocking insulating film 736 and spaces remaining among the plurality of gate spaces GS (see FIG. 17E), followed by partially removing the blocking insulating film 736 and the conductive layer for gate electrodes so that a sidewall of each of the plurality of insulating layers 726 in the plurality of openings 760 is exposed, whereby the blocking insulating film 736 and a gate electrode 764 remain in the plurality of gate spaces GS.

The tunnel dielectric film 734, the charge storage film 732, and the blocking insulating film 736, which are formed between the channel region 740 and the gate electrode 764, may constitute a gate dielectric film 738.

The gate electrode 764 may include a first conductive barrier film contacting the blocking insulating film 736 and a first conductive film formed on the first conductive barrier film. The first conductive barrier film may include a conductive metal nitride, for example, TiN or TaN. The first conductive film may include conductive polysilicon, a metal, a metal silicide, or a combination thereof.

A plurality of common source regions 768 may be formed in the substrate 710 by implanting impurities into the substrate 710 exposed through the plurality of openings 760.

Figure 17H:
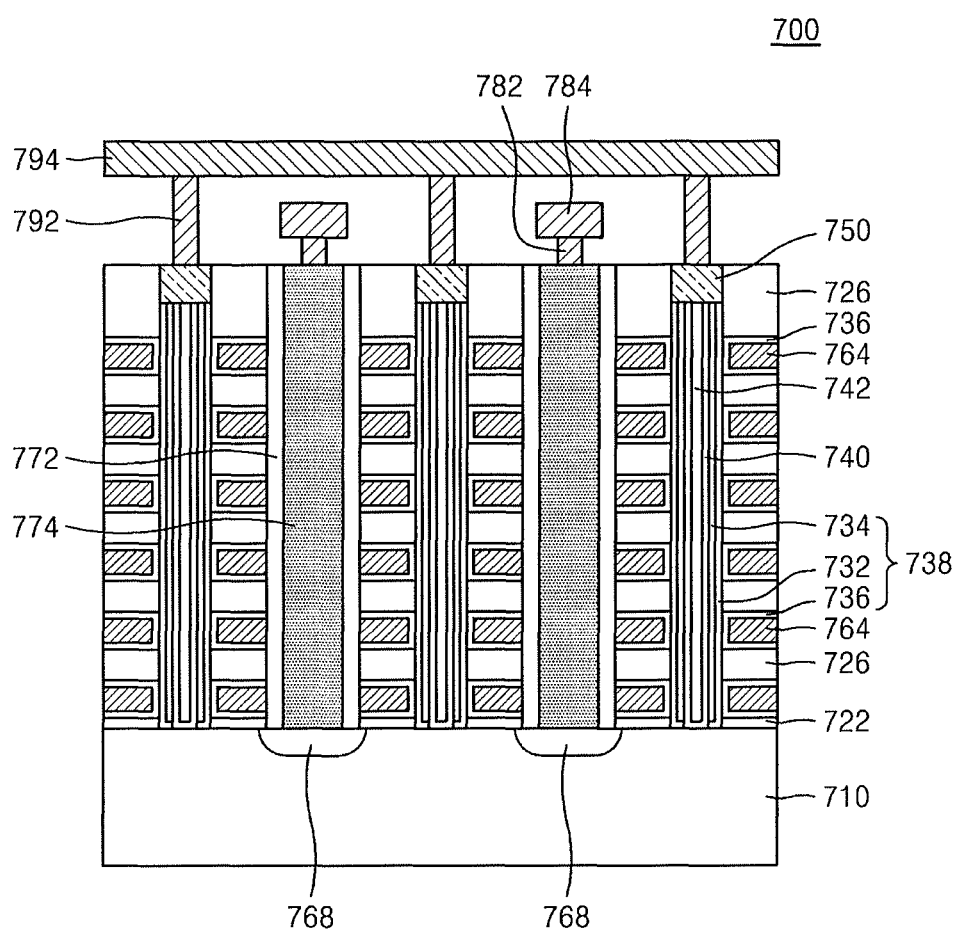

Referring to FIG. 17H, an insulating spacer 772 may be formed on an inner sidewall of each of the plurality of openings 760, and a conductive plug 774 may fill an inner space of each of the plurality of openings 760.

The insulating spacer 772 may include a silicon oxide film, a silicon nitride film, or a combination thereof. The conductive plug 774 may include a second conductive barrier film contacting the insulating spacer 772 and a second conductive film filling a space surrounded by the second conductive barrier film in each of the plurality of openings 760. The second conductive barrier film may include a conductive metal nitride, e.g., TiN or TaN, and the second conductive film may include a metal, e.g., tungsten.

A plurality of first contacts 782 and a plurality of first conductive layers 784 may be formed on a plurality of conductive plugs 774. Each of the plurality of first contacts 782 and a plurality of first conductive layers 784 may include a metal, a metal nitride, or a combination thereof.

A plurality of second contacts 792 and a plurality of bit lines 794 may be formed on a plurality of conductive patterns 750. Each of the plurality of second contacts 792 and the plurality of bit lines 794 may include a metal, a metal nitride, or a combination thereof.

According to the method of manufacturing the integrated circuit device 700, which has been described with reference to FIGS. 17A to 17H, by using the thin film forming method according to an embodiment to form the blocking insulating film 736, the blocking insulating film 736 including a thin film having a dense structure and a thickness less than a thickness of a monolayer obtained by the conventional ALD process may be formed, and the blocking insulating film 736 having uniform step coverage may be formed in a uniform thickness on a three-dimensional structure and in a hole each having a relatively large aspect ratio. In addition, an amount of impurities remained in the blocking insulating film 736 may be reduced, thereby improving the electric characteristics and reliability of the integrated circuit device 700 including the blocking insulating film 736.

Figure 18A:
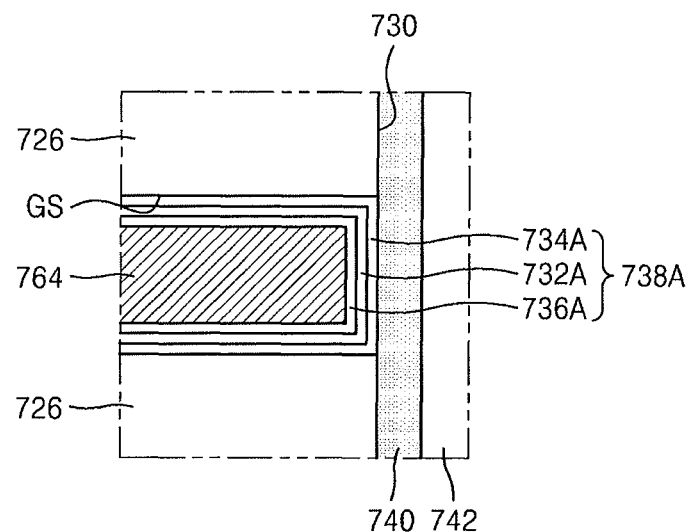
FIGS. 18A to 18C illustrate cross-sectional views showing examples of gate dielectric films obtained by a method of manufacturing an integrated circuit device, with reference to FIGS. 17A to 17H.
Figure 18B:
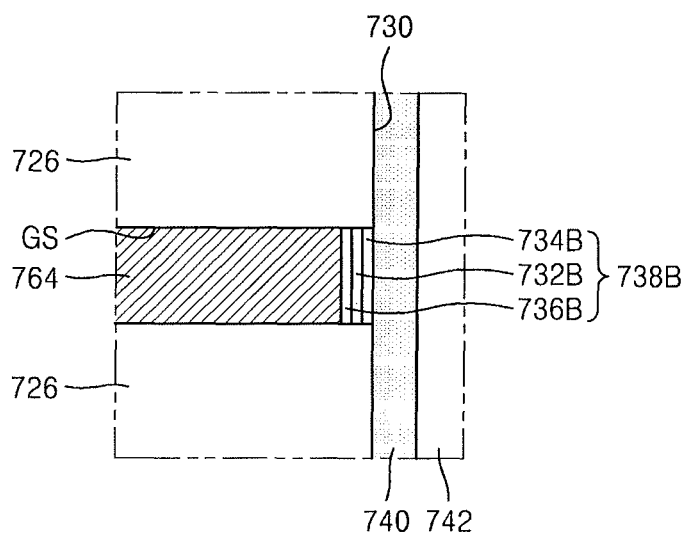
Figure 18C:
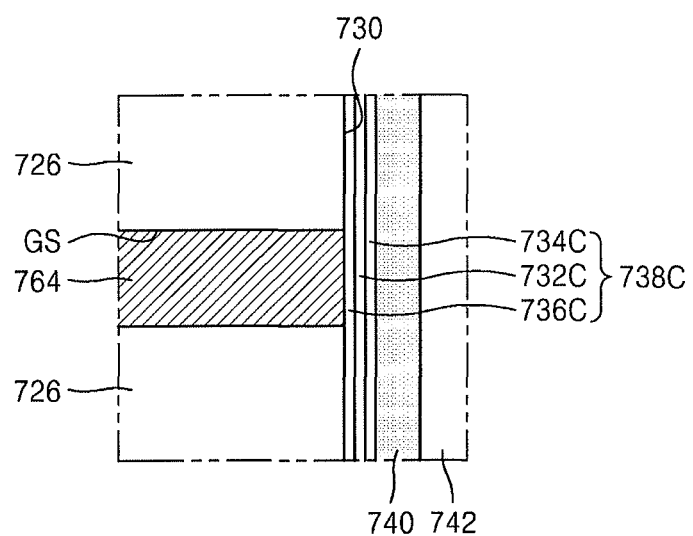

FIGS. 18A to 18C illustrate cross-sectional views showing example structures of other gate dielectric films 738A, 738B, and 738C, which may be used instead of the gate dielectric film 738 shown in FIGS. 17G and 17H in the method of manufacturing the integrated circuit device 700, the method having been described with reference to FIGS. 17A to 17H.

The integrated circuit device 700 shown in FIG. 17H may include a gate dielectric film 738A shown in FIG. 18A, a gate dielectric film 738B shown in FIG. 18B, or a gate dielectric film 738C shown in FIG. 18C instead of the gate dielectric film 738.

The gate dielectric film 738A shown in FIG. 18A may include a tunnel dielectric film 734A, a charge storage film 732A, and a blocking insulating film 736A, which are formed on the channel region 740 in this stated order and formed in a portion of the gate space GS between the channel region 740 and the gate electrode 764. The gate dielectric film 738B shown in FIG. 18B may include a tunnel dielectric film 734B, a charge storage film 732B, and a blocking insulating film 736B, which are formed from the channel region 740 in this stated order between the channel region 740 and the gate electrode 764. The gate dielectric film 738C shown in FIG. 18C may include a tunnel dielectric film 734C, a charge storage film 732C, and a blocking insulating film 736C, which are formed on the channel region 740 in this stated order and formed in a inner portion of the channel hole 730 between the channel region 740 and the gate electrode 764.

The blocking insulating films 736A, 736B, and 736C may be formed by the same method of forming the blocking insulating film 736 described with reference to FIG. 17F. Detailed configurations of the tunnel dielectric films 734A, 734B, and 734C, the charge storage films 732A, 732B, and 732C, and the blocking insulating films 736A, 736B, and 736C, which are shown in FIGS. 18A to 18C, are substantially the same as descriptions of the tunnel dielectric film 734, the charge storage film 732, and the blocking insulating film 736, which have been described with reference to FIGS. 17A to 17H.

Hereinafter, the thin film forming method according to an embodiment will be explained with reference to some examples.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1 (Thin Film Formation 1)

An aluminum oxide film was formed on a silicon substrate using acetylacetone as a reaction inhibiting compound, according to the thin film forming method described herein. To form the aluminum oxide film, an ALD process was performed, the container temperature of raw materials was 70° C., and the ALD process temperature (gas temperature) was about 300° C. to about 350° C. $O_3/O_2$ mixed gas was used as a reactive gas.

In order to perform the ALD process, with the following series of processes (1) to (6) being defined as one cycle, 500 cycles were performed.

(1) a process of forming a reaction inhibiting layer in which a vapor of acetylacetone vaporized by using Ar was supplied to the reaction chamber at a controlled pressure of 2 hPa for 10 seconds to be adsorbed on the substrate, (2) a purge process for removing unreacted raw materials by injecting Ar gas into the reaction chamber for 20 seconds, (3) a process of forming a precursor layer in which a vapor of trimethylaluminum (TMA) vaporized by Ar was supplied to the reaction chamber at a controlled pressure of 2 hPa for 30 seconds to adsorb onto the substrate, (4) a purge process for removing unreacted raw materials by injecting Ar gas into the reaction chamber for 20 seconds, (5) a process of forming a monolayer in which $O_3/O_2$ mixed gas containing $O_3$ gas at a concentration of 300 g/m$^3$ was introduced into the reaction chamber and reacted at a pressure of 2 hPa for 30 seconds, and (6) a purge process for removing unreacted raw materials by injecting Ar gas into the reaction chamber for 30 seconds.

A thickness of an aluminum oxide film obtained from the above processes was measured by an ellipsometer. The thickness of the aluminum oxide film obtained by each one cycle of the ALD process, that is, a deposition rate was about 0.47 Å/cycle to about 0.52 Å/cycle.

Figure 19:
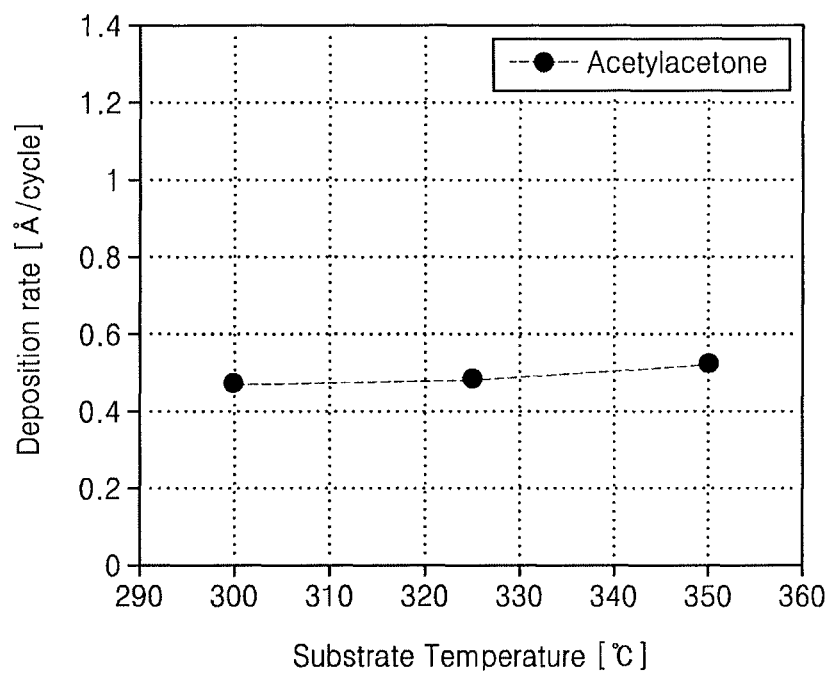
FIG. 19 illustrates a graph showing measurement results of a deposition rate of an aluminum oxide film obtained according to a thin film forming method of an embodiment with respect to a substrate temperature.

FIG. 19 illustrates a graph showing measurement results of a deposition rate of the aluminum oxide film obtained in Example 1 with respect to a substrate temperature. From the results of FIG. 19, when the substrate temperature was in a range of about 300° C. to about 350° C., a deposition rate showed almost no change with an increase of the substrate temperature, which is ideal ALD behavior.

Figure 20:
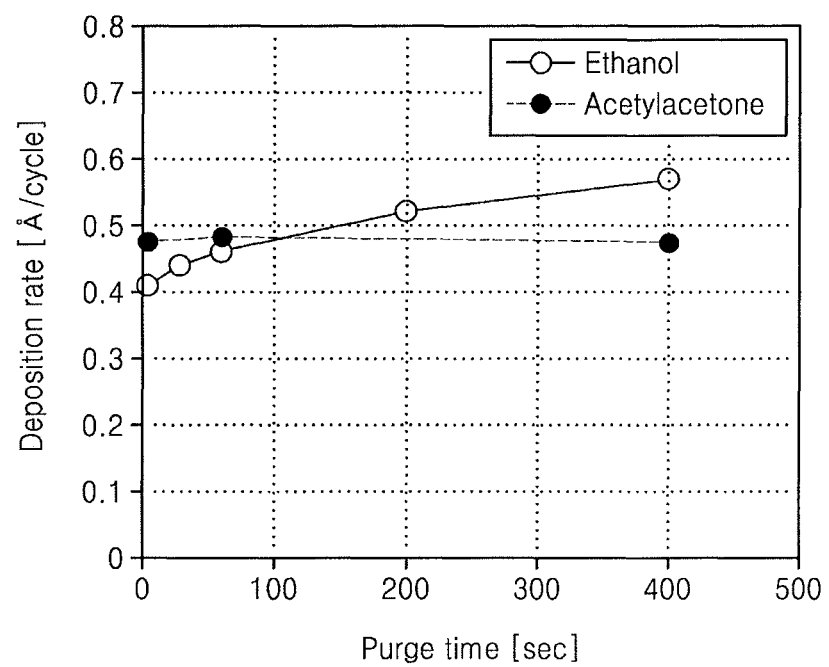
FIG. 20 illustrates a graph showing measurement results of a change in a deposition rate of an aluminum oxide film obtained according to a thin film forming method of an embodiment, with respect to a purge time.

FIG. 20 illustrates a graph showing measurement results of a change in a deposition rate of aluminum oxide films with respect to a purge time, wherein when a substrate temperature is 325° C. acetylacetone, which is a reaction inhibiting compound, was injected into the reaction chamber according to process (1), followed by forming a thin film by variously setting a purge time of process (2).

From the results of FIG. 20, unlike the case in which ethanol was used as a reaction inhibiting compound, when acetylacetone was used as the reaction inhibiting compound, it may be seen that a thin film deposition rate of about 0.47 Å/cycle was constantly maintained without any change, even when a purge time was increased. From the results of FIG. 20, it may be seen that acetylacetone strongly adsorbed on the substrate maintained stable bonding on the substrate without being desorbed at a comparatively high temperature of 325° C. and for a comparatively long purge time. In this regard, even when an ALD process was performed using a reaction chamber having a comparatively large internal volume, e.g., the substrate processing apparatus 410A including the reaction tube 510 in a batch type of FIG. 13, the ALD process may be stably performed and a thickness distribution of the aluminum oxide film may be improved.

Figure 21:
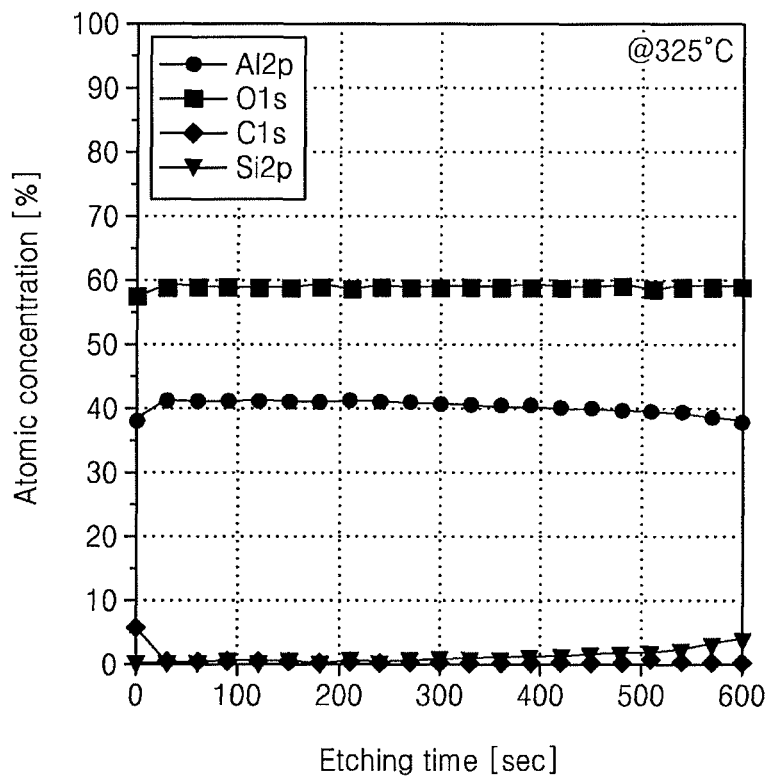
FIG. 21 illustrates a graph showing X-ray Photoelectron Spectroscopy (XPS) depth profiling results of an aluminum oxide film obtained according to a thin film forming method of an embodiment, for analyzing a concentration composition.

FIG. 21 illustrates a graph showing X-ray photoelectron spectroscopy (XPS) depth profiling results of the aluminum oxide film obtained in Example 1 for analyzing a concentration composition.

From the results of analyzing a thin film structure and a thin film composition by XPS, the obtained thin films were all aluminum oxide films. It may be seen that no impurities (such as carbon atoms derived from acetylacetone used as the reaction inhibiting compound) remained in the aluminum oxide film.

Example 2 (Thin Film Formation 2)

An aluminum oxide film was formed in the same manner as Example 1, except that 3,5-heptanedione was used instead of acetylacetone as the reaction inhibiting compound.

Figure 22:
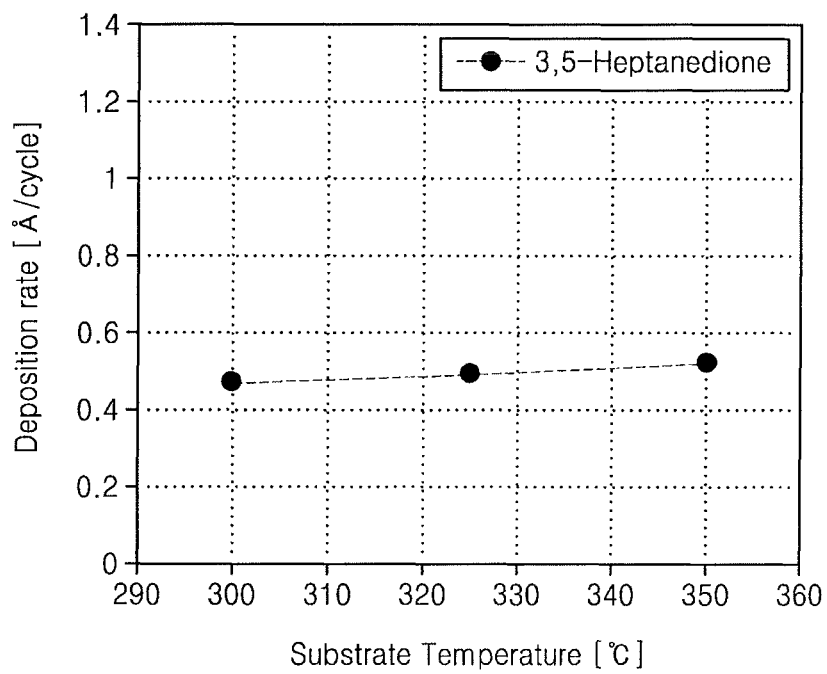
FIG. 22 illustrates a graph showing measurement results of a deposition rate of an aluminum oxide film obtained according to a thin film forming method of another embodiment, with respect to a substrate temperature.

FIG. 22 illustrates a graph showing measurement results of a deposition rate of the aluminum oxide film obtained in Example 2 with respect to a substrate temperature.

From the results of FIG. 22, when the substrate temperature was in a range of about 300° C. to about 350° C., a deposition rate showed almost no change with an increase of the substrate temperature, which is an ideal ALD behavior.

Figure 23:
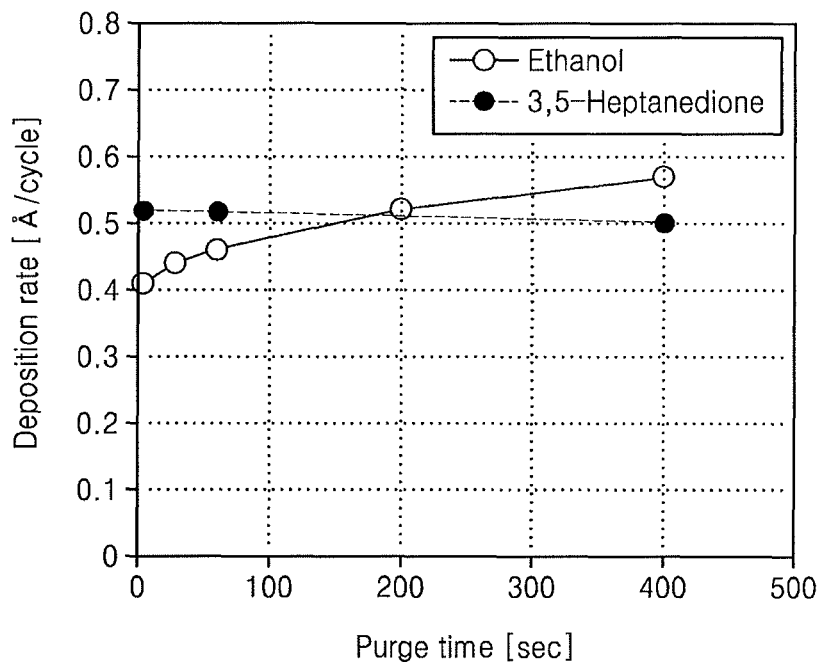
FIG. 23 illustrates a graph showing measurement results of a change in a deposition rate of an aluminum oxide film obtained according to a thin film forming method of another embodiment, with respect to a purge time.

FIG. 23 illustrates a graph showing measurement results of a change in a deposition rate of aluminum oxide films with respect to a purge time, wherein when a substrate temperature was 325° C., 3,5-heptanedione, which is a reaction inhibiting compound, was injected into the reaction chamber according to process (1), followed by forming a thin film by variously setting a purge time of process (2).

From the results of FIG. 23, unlike the case in which ethanol was used as a reaction inhibiting compound, when 3,5-heptanedione was used as the reaction inhibiting compound, it may be seen that a thin film deposition rate of about 0.47 Å/cycle was constantly maintained without any change even when a purge time was increased. It may be seen that even when 3,5-heptanedione was used as the reaction inhibiting compound, 3,5-heptanedione maintained stable bonding on the substrate without being desorbed at a comparatively high temperature of 325° C. and for a comparatively long purge time as shown in Example.

Figure 24:
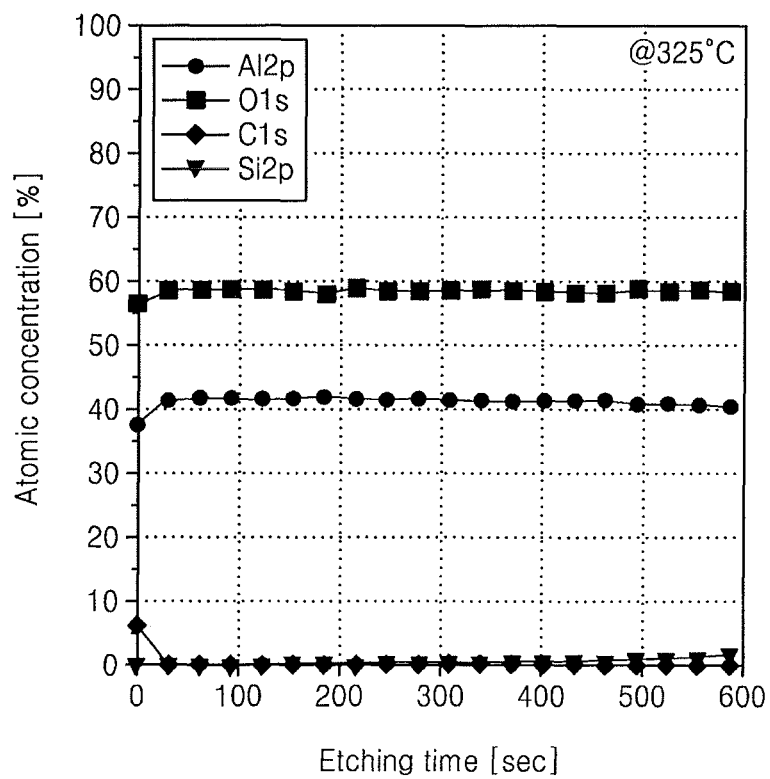
FIG. 24 illustrates a graph showing XPS depth profiling results of an aluminum oxide film obtained according to a thin film forming method of another embodiment, for analyzing a concentration composition.

FIG. 24 illustrates a graph showing XPS depth profiling results of the aluminum oxide film obtained in Example 2 for analyzing a concentration composition.

From results of analyzing a thin film structure and a thin film composition by XPS, it may be seen that the obtained thin films were all aluminum oxide films. It may be seen that no impurities (such as carbon atoms derived from 3,5-heptanedione used as the reaction inhibiting compound) remained in the aluminum oxide film.

As may be seen from the results of Examples 1 and 2, unlike other thin film forming methods in which a thin film has a comparatively large deposition rate of about 1.2 Å/cycle, according to the thin film forming method of the present disclosure, a precursor for forming a thin film may be prevented from excessively being adsorbed on a substrate by using a reaction inhibiting compound having a carbonyl group so that a thin film deposition rate may be reduced to, e.g., about 0.47 Å/cycle to about 0.52 Å/cycle, which is a reduction of more than about 50% compared to other thin film forming methods. Thus, when adopting a mass process for manufacturing an integrated circuit device highly integrated and having a complicated three-dimensional structure, process stability may be secured. In addition, it may also be easy to control a thickness of a desired thin film, as well as a thickness uniformity and/or step coverage of a thin film. Also, even when a temperature of the ALD process is set to a comparatively high temperature of about 300° C. to about 600° C. and a purge time is increased during the ALD process to prevent impurities from remaining in a thin film to be formed, the reaction inhibiting compound may not be desorbed from the substrate and may maintain a stable bonding thereto at a comparatively high temperature and for a comparatively long purge time, thereby enabling the ALD process to be stably performed.

Comparative Example

An aluminum oxide film was formed in the same manner as Example 1, except that a temperature of the ALD process was 175° C.

Figure 25:
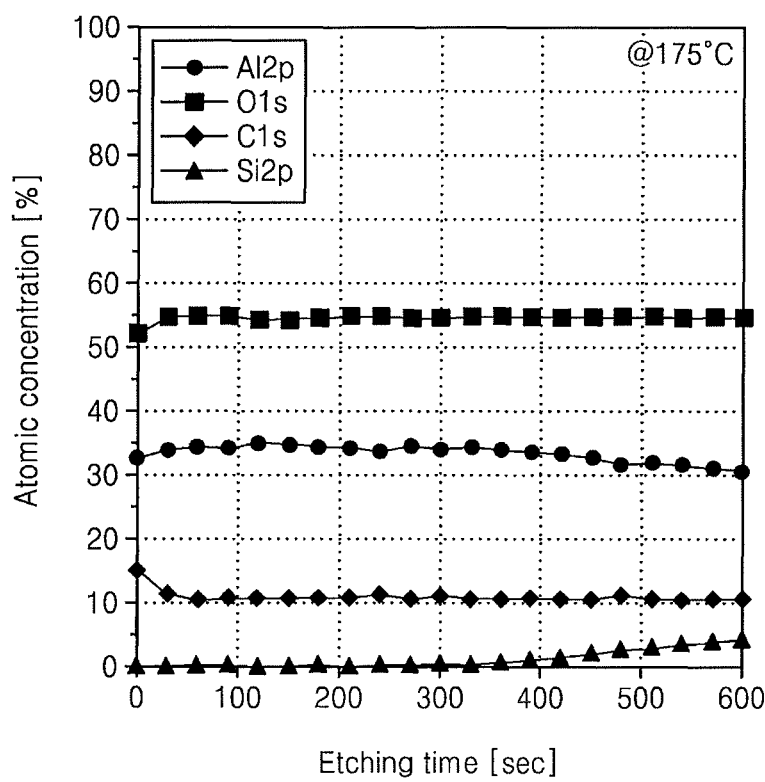
FIG. 25 illustrates a graph showing XPS depth profiling results of the aluminum oxide film obtained in a Comparative Example for analyzing a concentration composition.

FIG. 25 illustrates a graph showing XPS depth profiling results of the aluminum oxide film obtained in Comparative Example for analyzing a concentration composition. As may be seen from the results of FIG. 25, when an aluminum oxide film was formed at a comparatively low temperature of 175° C., a large amount of carbon impurities were introduced into the aluminum oxide film, and thus contained carbon impurities of about 10%. It may be understood that when the ALD process is performed at a comparatively low temperature, the activity of oxygen may be lowered and thus the oxidizing power may be insufficient, thus causing a large amount of impurities to remain in the aluminum oxide film. As described above, if a large amount of carbon impurities were to remain in the aluminum oxide film, the characteristics of the aluminum oxide film could deteriorate and thus, it may be difficult to expect the desired electric characteristics when adopted in an integrated circuit device.

However, according to the thin film forming method of an embodiment, a thin film may be formed by using a reaction inhibiting compound having a carbonyl group at a comparatively high temperature of about 300° C. to about 600° C., and thus, it is possible to provide sufficient oxidizing power in the fully activated state of oxygen when performing the ALD process, thereby obtaining a clean thin film in which no impurities such as carbons derived from a reaction inhibiting compound.

In the thin film forming method according to an embodiment, a thin film having a dense structure and a thickness less than a thickness of a monolayer obtained by other ALD processes may be formed without impurities, and a thickness of a desired thin film, and thickness uniformity and step coverage of a thin film may be easily controlled.

In a method of manufacturing an integrated circuit device according to an embodiment, a thin film having a small thickness and a dense structure may be formed with a uniform thickness on a three-dimensional structure having a large aspect ratio, and a thin film without impurities may be formed, thereby improving electric characteristics and reliability of an integrated circuit device.

An embodiment may provide a manufacturing method capable of forming a uniform thin film with excellent step coverage on a three-dimensional structure having a large aspect ratio. In addition, the thickness of an integrated circuit device may be reduced with scaling down of integrated circuit devices having a high degree of integration.

The embodiments may provide a method of forming a thin film containing a metal and a method of manufacturing an integrated circuit device using the same.

The embodiments may provide a thin film forming method in which a thin film having no impurities and a very small thickness is formed on a three-dimensional structure having a large aspect ratio and a thickness uniformity and step coverage of the thin film are easily controlled.

The embodiments may provide a thin film that has a very small and uniform thickness and is formed with no impurities and excellent step coverage on a three-dimensional structure having a large aspect ratio, thereby providing a method of manufacturing an integrated circuit device, which results in excellent electric characteristics and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a thin film, the method comprising:
   forming a first reaction inhibiting layer chemisorbed on a first portion of a lower film by supplying a reaction inhibiting compound having a carbonyl group to an exposed surface of the lower film at a temperature of about 300° C. to about 600° C.;
   forming a first precursor layer of a first material chemisorbed on a second portion of the lower film at a temperature of about 300° C. to about 600° C., the second portion being exposed through the first reaction inhibiting layer; and
   forming a first monolayer containing the first material on the lower film by supplying a reactive gas to the first reaction inhibiting layer and the first precursor layer and removing the first reaction inhibiting layer from the surface of the lower film, and thus exposing the first portion.

2. The method as claimed in claim 1, wherein the reaction inhibiting compound includes a ketone functional group, a diketone functional group, a triketone functional group, a ketene functional group, an aldehyde functional group, an ester functional group, a carboxylic acid functional group, or an amide functional group.

3. The method as claimed in claim 1, wherein the reaction inhibiting compound is a β-diketone compound.

4. The method as claimed in claim 1, wherein the reactive gas is an oxidizing gas or a nitriding gas.

5. The method as claimed in claim 1, wherein the reactive gas includes $O_3$.

6. The method as claimed in claim 1, wherein the first material is a metal or a semi-metal.

7. The method as claimed in claim 1, wherein the first material is aluminum (Al).

8. The method as claimed in claim 1, wherein:
   the lower film includes a first metal oxide having a first dielectric constant, and
   the first monolayer includes a second metal oxide having a second dielectric constant, the second dielectric constant being less than the first dielectric constant.

9. The method as claimed in claim 1, further comprising, after forming the first monolayer:
   forming a second reaction inhibiting layer chemisorbed on the first monolayer and the first portion of the lower film by supplying the reaction inhibiting compound to the first monolayer and the first portion of the lower film;
   forming a second precursor layer of the first material chemisorbed on some portions of the first monolayer exposed through the second reaction inhibiting layer; and
   supplying the reactive gas to the second reaction inhibiting layer and the second precursor layer to form a second monolayer containing the first material by a reaction between the reactive gas and the second precursor layer while removing the second reaction inhibiting layer by a reaction between the reactive gas and the second reaction inhibiting layer.

10. The method as claimed in claim 9, wherein, in the forming of the second monolayer, at least some portions of the second monolayer are deposited on the lower film from the first monolayer in a lateral direction, which is parallel to an extension direction of a main surface of the lower film.

11. A method of manufacturing an integrated circuit device, the method comprising:
forming a lower structure on a substrate, and
forming an aluminum-containing film on the lower structure by performing the method as claimed in claim 1.

12. The method as claimed in claim 11, wherein:
forming the lower structure includes:
   forming a lower electrode of a capacitor on the substrate, and
   forming a zirconium oxide film, of which some portions are in an amorphous state, on the lower electrode at a first temperature of less than 300° C., and
forming the film containing aluminum includes:
   forming the first reaction inhibiting layer chemisorbed on a surface of the zirconium oxide film by supplying the reaction inhibiting compound to the surface of the zirconium oxide film at a second temperature of about 300° C. to about 600° C. to crystallize at least some portions of the zirconium oxide film,
   forming a first aluminum precursor layer chemisorbed on the surface of the zirconium oxide film at a third temperature that is greater than the first temperature, the zirconium oxide film being exposed through the first reaction inhibiting layer, and
   forming a first monolayer that includes aluminum oxide from the first aluminum precursor layer by supplying an oxidizing agent to the first reaction inhibiting layer and the first aluminum precursor layer at a fourth temperature that is greater than the first temperature, and simultaneously exposing some portions of the zirconium oxide film through the first monolayer by removing the first reaction inhibiting layer from the zirconium oxide film.

13. The method as claimed in claim 12, wherein the reaction inhibiting compound includes a ketone functional group, a diketone functional group, a triketone functional group, a ketene functional group, an aldehyde functional group, an ester functional group, a carboxylic acid functional group, or an amide functional group.

14. The method as claimed in claim 12, wherein the third temperature and the fourth temperature are each independently about 300° C. to about 600° C.

* * * * *